(12) United States Patent
Ikegami et al.

(10) Patent No.: US 6,332,567 B1
(45) Date of Patent: *Dec. 25, 2001

(54) PIEZOELECTRIC ELEMENT, MANUFACTURING METHOD THEREOF, AND MOUNTING APPARATUS OF PIEZOELECTRIC RESONATORS

(75) Inventors: Yasumitsu Ikegami; Takuya Miyakawa, both of Suwa (JP)

(73) Assignee: Seiko Epson Corporation, Nagano-ken (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/819,155

(22) Filed: Mar. 17, 1997

(30) Foreign Application Priority Data

Mar. 18, 1996 (JP) .................................. P8-087043
Dec. 26, 1996 (JP) .................................. P8-356475

(51) Int. Cl.⁷ .................................................. B23K 31/00
(52) U.S. Cl. ................ 228/179.1; 228/206; 228/211; 228/220; 228/203; 228/205; 228/37; 228/42; 228/43; 228/219
(58) Field of Search .............................. 228/179.1, 206, 228/211, 220, 203, 205, 37, 42, 43, 219

(56) References Cited

U.S. PATENT DOCUMENTS

| | | |
|---|---|---|
| 2,085,587 * | 6/1937 | Hotchkiss . |
| 3,762,941 | 10/1973 | Hou . |
| 4,012,307 | 3/1977 | Phillips . |
| 4,430,547 | 2/1984 | Yoneda et al. . |
| 4,705,593 | 11/1987 | Haigh et al. . |
| 4,708,766 | 11/1987 | Hynecek . |
| 4,749,440 | 6/1988 | Blackwood et al. . |
| 4,857,382 | 8/1989 | Liu et al. . |
| 4,921,157 | 5/1990 | Dishon et al. . |
| 5,000,819 | 3/1991 | Pedder et al. . |

(List continued on next page.)

FOREIGN PATENT DOCUMENTS

| | | |
|---|---|---|
| 371693 | 6/1990 | (EP) . |
| 1-125829 | 5/1963 | (JP) . |
| 84-158525 | 9/1984 | (JP) . |
| 61-127866 | 6/1986 | (JP) . |
| 2-190489 | 7/1990 | (JP) . |
| 2-281734 | 11/1990 | (JP) . |
| 3-174972 | 7/1991 | (JP) . |
| 3-219082 | 9/1991 | (JP) . |
| 3-219082 | 10/1991 | (JP) . |
| 3-236475 | 10/1991 | (JP) . |
| 4-186619 | 7/1992 | (JP) . |
| 6-190269 | 12/1992 | (JP) . |
| 5-82478 | 4/1993 | (JP) . |
| 6-2149 | 1/1994 | (JP) . |
| 60-1861 | 8/1995 | (JP) . |

Primary Examiner—M. Alexandra Elve
(74) Attorney, Agent, or Firm—Stroock & Stroock & Lavan LLP

(57) ABSTRACT

An improved method of manufacturing a piezoelectric element and an improved piezoelectric element are provided. The improved method comprises the steps of causing a gas discharge in a predetermined discharge gas at approximately atmospheric pressure and generating an excited active species of the discharge gas as a result of the gas discharge. Then, at least one of a connecting surface of an electrode formed of a piezoelectric piece on a piezoelectric resonator and a connecting portion of a lead terminal are exposed to the excited active species, whereby the exposed connecting portions are surface treated. Finally, the electrode and the lead terminal are connected together, and at least the electrode and the lead terminal are sealed in a case. The improved piezoelectric element is formed by this process and uses less solder and is more stable than prior art piezoelectric elements.

8 Claims, 15 Drawing Sheets

U.S. PATENT DOCUMENTS

| | | |
|---|---|---|
| 5,045,166 | 9/1991 | Bobbio . |
| 5,120,568 | 6/1992 | Schuurmans et al. . |
| 5,126,164 | 6/1992 | Okazaki et al. . |
| 5,147,520 | 9/1992 | Bobbio . |
| 5,161,727 * | 11/1992 | Leturmy et al. ................ 228/37 |
| 5,178,682 | 1/1993 | Tsukamoto et al. . |
| 5,201,995 | 4/1993 | Reisman et al. . |
| 5,225,659 | 7/1993 | Kusano et al. . |
| 5,240,559 | 8/1993 | Ishida . |
| 5,290,378 | 3/1994 | Kusano et al. . |
| 5,292,370 | 3/1994 | Tsai et al. . |
| 5,316,739 | 5/1994 | Yoshikawa et al. . |
| 5,340,618 | 8/1994 | Tanisaki et al. . |
| 5,368,685 | 11/1994 | Kumihashi et al. . |
| 5,384,167 | 1/1995 | Nishiwaki et al. . |
| 5,391,855 | 2/1995 | Tanisaki . |
| 5,399,830 | 3/1995 | Maruyama . |
| 5,407,121 | 4/1995 | Koopman et al. . |
| 5,433,820 * | 7/1995 | Sindzingre et al. ............... 216/13 |
| 5,449,432 | 9/1995 | Hanawa . |
| 5,499,754 | 3/1996 | Bobbio et al. . |
| 5,597,438 | 1/1997 | Grewal et al. . |
| 5,609,290 * | 3/1997 | Bobbio et al. ................ 228/206 |

\* cited by examiner (A)

(B)

PIEZOELECTRIC ELEMENT, MANUFACTURING METHOD THEREOF, AND MOUNTING APPARATUS OF PIEZOELECTRIC RESONATORS

BACKGROUND OF THE INVENTION

1. Field of the Invention

This invention relates generally to a piezoelectric element such as a piezoelectric resonator or a surface acoustic wave (SAW) device made of a piezoelectric crystal such as quartz crystal or a piezoelectric ceramic material. More particularly, the present invention relates to a piezoelectric element which is surface treated using an excited active species generated in plasma at approximately atmospheric pressure during manufacture. The invention also relates to a method of manufacturing such a piezoelectric element, and a mounting apparatus for connecting a piezoelectric resonator to an external connecting plug or a lead during the manufacturing process thereof.

2. Description of the Related Art

It is conventionally well known in the art to provide a piezoelectric element which operates in accordance with a piezoelectric effect principle based upon a resonance. Such a piezoelectric element may be employed for use in a resonator, an oscillator or a filter. There are a number of types of piezoelectric elements. These include a piezoelectric element formed as a tuning fork operating within a frequency band ranging from about 20 kHz to 1 MHz, a piezoelectric resonator such as an AT-cut resonator operating within a frequency range of from about 4 to 125 MHz, and a SAW device using a surface acoustic wave.

In general, a piezoelectric resonator is formed of a resonator comprising a piezoelectric piece having an electrode formed on the surface thereof and a plug coupled to the resonator. A lead is also provided for electrically connecting the plug to an outside electrical circuit. Finally, a case housing for the resonator is provided. The resonator is sealed within the case in an air-tight manner. Usually, connection between the resonator and the plug is accomplished by soldering an inner lead terminal of the plug onto a land of the resonator. The reflow process is commonly used as the soldering process, and comprises the steps of plating a predetermined amount of solder onto the surface of the inner lead terminal and then melting the solder with a hot blast or with infrared rays to allow the connection between the plug and the land.

A SAW device, which permits stable achievement of a high frequency within a range of from between 100 MHz to the giga Hz band, may be used to construct a SAW resonator for use in an oscillating circuit and a SAW filter for high frequencies. In general, a SAW device comprises a piezoelectric substrate having a fine comb-shaped electrode formed on the surface thereof. The substrate is sealed in a case in an air-tight manner, and the comb-shaped electrode is connected to an electrode terminal of the case by wire bonding. Recently, the inventors of the present invention have developed a SAW device having an improved construction in which the inner lead of a plug is soldered to the land of a piezoelectric substrate. The SAW device is then sealed in a case in an air-tight manner, as in the above-mentioned conventional piezoelectric resonator.

To remove an oxide film which may be spontaneously formed on the substrate when the substrate comes into contact with ambient air, and for improving the wettability of solder, a flux is often used during the soldering process. However, when using such a flux on a piezoelectric element, residual flux or splash may cause corrosion of the electrode on the piezoelectric piece surface and may in turn deteriorate the performance of the piezoelectric piece. Thus, a process for improving wettability which does not use a flux would be beneficial. However, because such conventional fluxless processes cannot remove the oxide film from the surface of the substrate, i.e., the land, the wettability of the solder greatly varies in accordance with varying surface conditions. This in turn may result in defective soldering and a decrease in the production yield of the piezoelectric pieces.

In order to avoid defective soldering which maybe caused by a low wettability of the employed solder, a number of conventional measures may be employed. These include increasing the heating temperature to the range of about 430 to 450° C. or increasing the amount of solder used. However, when a quartz crystal is employed as the piezoelectric piece, excessive heating may cause distortion, resulting in a twin crystal having deteriorated properties such as CI (crystal impedance) value and temperature coefficient. Additionally, this excessive heating may result in soldering erosion or the thin film land, thus leading to a soldering defect.

The utilization of a larger amount of solder increases the manufacturing cost. Soldering of a deposit having a thickness of over 20 to 25 mm on the surface of the inner lead requires a great amount of time and results in a tendency of the lead to bend. Furthermore, if molten solder does not flow sufficiently around the inner lead, a sufficient mechanical connection strength will not be obtained even though the electrode is physically connected to the lead. Thus, any impact may cause peeling of the resonator from the lead. Finally, adhesion of molten solder to the electrode may cause performance problems such as unstable frequency maintenance by the piezoelectric element or an increase in the CI value. Therefore, it would be beneficial to provide an improved piezoelectric element which overcomes these problems of the prior art.

In order to increase productivity, a batch treatment method may be employed in which a plurality of piezoelectric resonators are surface treated at a time. This method is favorable for improving productivity in an actual manufacturing line. However, during this process of improving wettability, the entire surface of the piezoelectric resonator may be treated. Thus, any solder employed would flow to portions of the electrode which are not to be connected to the lead. This may lead to an immediate degradation of performance of the piezoelectric element, or may also lead to a decrease in the performance of the piezoelectric element over time during use. Therefore, it would also be beneficial to provide a method of manufacture which overcomes these problems of the prior art.

SUMMARY OF THE INVENTION

Generally speaking, in accordance with the invention, a piezoelectric element and a method of forming the same is provided which overcomes the problem of the prior art. The piezoelectric element comprises a piezoelectric resonator composed of a piezoelectric piece forming an electrode on the surface thereof, and a lead coupled to the piezoelectric piece for electrically connecting the electrode to an external electric circuit. The electrode and the lead are connected together. The connecting surface of at least one of the electrode and the lead is previously surface-treated so as to improve wettability. The foregoing electrode and lead are connected by soldering or brazing.

The surface treatment method noted above is employed to improve wettability of the electrode and/or the lead which may be covered with an oxide film. This film may be formed spontaneously when either the lead or electrode comes into contact with ambient air, or other environmental conditions. The surface treatment utilizes one of two processes. The first is a halogenation treatment, which forms a halogenated layer such as a fluorinated layer on the surface layer of he foregoing oxide film and utilizes a halogen such as fluorine. The second is a reduction treatment, which removes the oxide film on the surface of the foregoing electrode or lead or reduces the surface layer thereof. Because the connection surfaces of the electrode and the lead which undergo such a surface treatment have an improved wettability, they may be connected in a more satisfactory state, and a high electrical and mechanical reliability is attained for the connected portion.

The method for surface treating the connecting portions, such as is noted above, can be easily carried out in a short period of time at a low cost in accordance to the invention. By causing gas discharge in a predetermined discharge gas at approximately atmospheric pressure, and exposing the surface to be treated, in this case at least one of the connecting portions of the land and/or lead, to an excited active species of the predetermined discharge gas produced therefrom, surface treatment can be carried out. The halogenation type surface treatment is carried out by using a discharge gas containing halogen. The reduction type of surface treatment is carried out by using a mixed gas containing at least nitrogen and water or hydrogen as the discharge gas. Compressed air may be used as the mixed gas.

According to another aspect of the invention, a method of manufacturing of a piezoelectric element is provided, which comprises the steps of connecting a lead, for electrically connecting an electrode to an external electrical circuit, to a piezoelectric resonator having a piezoelectric piece forming the electrode on the surface of the piezoelectric resonator, and sealing the piezoelectric resonator in a case. Before connecting the electrode and the lead, gas discharge is generated in a predetermined discharge gas at approximately atmospheric pressure. The surface of either the electrode or the lead or both is treated prior to connection by exposing the surface to an excited active species of the discharge gas, which is generated from the gas discharge. After surface treatment, the electrode and the lead can be connected through soldering such as brazing as is known in the conventional art.

When a gas containing a halogen is utilized as the discharge gas, the connection surface of the electrode and/or lead is halogenated, thus forming a halogenated layer. For example, a fluorinated layer is formed on the connection surface when a gas containing fluorine is utilized as the discharge gas. When a mixed gas containing at least nitrogen and water, for example compressed air or hydrogen gas, is utilized as the discharge gas, the connection surface is reduced.

When a surface is treated by a plasma generated at approximately atmospheric pressure as a pre-treatment for connecting the electrode and the lead, the wettability of the connection surface of the electrode is improved. Thus, the connecting process is easier to perform, and the connection is improved. Since the improved wettability reduces the consumption of brazing material such as solder during soldering, the manufacturing cost is reduced. Particularly, when a surface is treated by a plasma generated at approximately atmospheric pressure, relatively easy incorporation of the surface treatment process into a conventional process of connecting the electrode and the plug is possible, thus forming an improved, inline connection process. It is therefore possible to continuously surface treat surfaces which are to be connected. It is therefore possible to reduce the cost of production and improve productivity. It is also easier to maintain and produce a high quality piezoelectric element capable of a high quality performance.

A conventional means of surface treatment for forming a fluorinated film on a surface to increase wettability employs plasma produced in a vacuum. This method however requires special facilities and a special apparatus, resulting in a higher cost. Furthermore, it is difficult to incorporate processing with this plasma produced in a vacuum in an inline system or in a continuous treatment apparatus. Thus, improvement in productivity of production is difficult to achieve.

Another conventional prior art method of surface treatment includes immersing a workpiece in a solvent, thereby forming a fluorinated film on the entire surface of the workpiece. However, when using such a method, it is generally difficult to control solvent concentration and temperature. This prior art method requires the coordination of complicated operations such as washing and drying after film formation, thus making it very difficult to improve production productivity. Application of such a technique to the piezoelectric element of the invention poses an additional risk of generating impurities which reduce the frequency of the resonator. The method of manufacturing a piezoelectric element of the invention eliminates these problems with the conventional method.

According to another aspect of the invention, a method of manufacturing a piezoelectric element is provided which comprises the steps of connecting a lead, for electrically connecting an electrode to an external electrical circuit, to a piezoelectric resonator, comprising a piezoelectric piece having the electrode formed on the surface of the piezoelectric piece, and sealing the piezoelectric resonator in a case. The method further comprises the steps of blowing a hot blast to the connection surface of the electrode and the lead, thereby melting a solder previously supplied onto the connection surface of either the electrode and/or the lead to solder the electrode and the lead together. The hot blast contains an excited active species produced at approximately atmospheric pressure in a gas discharge in a predetermined discharge gas.

By utilizing a hot blast containing an excited active species of the discharge gas, as described above, wettability of solder is improved through surface treatment of the connection surface of the electrode and the lead by the active species. At the same time, the solder is melted. Thus, it is possible to satisfactorily solder the electrode and the lead without degrading the wettability of the connection and the electrode, the lead and the mounting mechanism need not be shielded from the open air to prevent oxidation.

In an additional embodiment, an excited active species of the discharge gas can be added into the hot blast after the hot blast is produced and before blowing the hot blast to the connection surface of the electrode or the lead. In this case, there is no risk of the heating means of the hot blast deteriorating from coming into contact with the excited active species. This practice is therefore advantageous.

In another embodiment, a hot blast is generated by introducing an excited active species of the discharge gas to a predetermined gas and then heating the predetermined gas to a high temperature. It is thus possible to blow the generated hot blast to the connection surface of the electrode or the lead. In this case, the temperature of the hot blast can be more accurately adjusted. However, the heating means of the hot blast may deteriorate under the effect of the excited active species.

A preferable discharge gas for generating an excited active species to be contained in the hot blast is, for example, a gas containing a halogen such as fluorine, such as $CF_4$. In terms of prevention of oxidation of the connection surface and cost, a preferable gas for generating the hot blast is nitrogen, since the oxidation of the connection surface is prevented and the cost is reduced.

Furthermore, according to the invention, a mounting apparatus for mounting a piezoelectric resonator is provided. The mounting apparatus is designed for connecting a piezoelectric resonator. The piezoelectric resonator comprises a piezoelectric piece having an electrode formed on the surface thereof and connected a lead for electrically connecting the electrode to an external electrical circuit by a reflow soldering process. The mounting apparatus comprises a heater for generating hot blast by heating a prescribed gas to a high temperature, a nozzle for ejecting the hot blast onto the connection surface of the electrode and the lead, and a discharger for generating an excited active species of a predetermined discharge gas by causing gas discharge in the discharge gas at approximately atmospheric pressure. The excited active species of the generated discharge gas is supplied to the nozzle so that the excited active species is ejected together with the hot blast.

As the hot blast and the excited active species of the discharge gas are ejected together from the nozzle onto the connection surfaces of the electrode and the lead, improvement of the wettability to these connection surfaces can be improved, and these surfaces can be soldered together simultaneously in a single process. In addition, it is not necessary to provide a special structure for shielding the electrode and the lead from ambient air to prevent oxidation of the connection surfaces, thus permitting downsizing and simplification of the apparatus as a whole.

The excited active species of the discharge gas can be supplied to the nozzle downstream from the heater means. This is advantageous since the excited species is not brought into contact with the heater. Thus, the risk of the excited active species contacting and exerting an adverse effect on the heater is eliminated. Thus, it is not necessary to provide additional means to prevent this contact.

In another embodiment, the excited active species of the discharge gas can be supplied to the nozzle upstream of the heating means. It is thus possible to more accurately and easily adjust temperature of the hot blast. However, because the active species will be brought into contact with the heater, the durability of the heater maybe affected.

A conventional electric heating coil may be used to generate the hot blast and may be positioned in the nozzle.

It is advantageous to form a discharge tube of a dielectric material as the discharge means and to cause the tube to communicate with the interior of the nozzle. Thus, it is possible to adjust the amount of the discharge gas to be mixed into the hot blast. The density of the excited active species to be contained for supply can therefore be controlled.

In addition, according to the invention, a method of manufacturing a piezoelectric element is provided. This manufacturing method comprises the steps of connecting a lead, for electrically connecting an electrode to an external electrical circuit, to a piezoelectric resonator, comprising a piezoelectric piece having an electrode formed on the surface thereof, and sealing the piezoelectric resonator in a case. The method further comprises the steps of arranging masks in close contact onto a plurality of the piezoelectric resonators at predetermined positions so as to expose only desired portions of the connection surface of the electrode before connecting the electrode and the lead. The connection surfaces of the piezoelectric resonator are exposed to an excited active species of a discharge gas generated by causing gas discharge in a predetermined discharge gas at approximately atmospheric pressure, thereby applying a surface treatment to the connection surfaces prior to connecting each of the leads to each of the electrodes.

As a pre-treatment for connecting the electrode and the lead by brazing, such as soldering, the use of a mask permits simultaneous surface treatment of only the desired portions of a plurality of piezoelectric resonators. Thus, the wettability of a small predetermined area is improved so that a satisfactory connection between a brazing material and the surface can be achieved. Because the other portions of the surface are not surface treated, there is no risk of the brazing material flowing from the desired connection surfaces to the other portions of the surface and exerting an adverse effect on the piezoelectric element when connecting the electrode and the lead in a subsequent step. In the manufactured piezoelectric element, there is no risk of the brazing material flowing form the desired connection surfaces to the other portions of the surface even if the piezoelectric element is exposed to a high temperature during production or service. It is therefore possible to prevent changes in frequency or CI-value over time or during use.

Particularly in the manufacture of a tuning fork piezoelectric resonator, it is possible to treat a plurality of piezoelectric resonators in the original form of a piezoelectric wafer having many tuning fork shapes and electrodes formed on the surface thereof, thus permitting easy positioning of the mask and simpler operation of the apparatus. The invention is applicable also in a case where the individual piezoelectric resonators take the form of individual piezoelectric chips having electrodes formed on the surfaces thereof as in AT cut resonators and SAW devices. Attaching a plurality of piezoelectric resonators to a mask as described above is advantageous in that it is possible to uniformly improve wettability for a plurality of piezoelectric resonators by arranging them in a chamber shielded from ambient air, diffusing the excited active species of the discharge gas in the chamber, and surface-treating the connecting surfaces of the electrodes.

By forming the mask of a ferromagnetic material it is possible to magnetically attract the base plate mounting to the mask. Thus the mask is closely and precisely adhered onto the piezoelectric resonators. Easy positioning of the mask is permitted, and the mask is prevented from moving from a prescribed position.

An object of the invention is to provide an improved piezoelectric element which always permits satisfactory connection of a resonator, comprising a piezoelectric piece having an electrode formed on the surface thereof, and a lead, for forming an electrical connection with an external electrical circuit with smaller amounts of solder at a lower heating temperature by improving wettability of the connection surface of the solder.

Another object of the invention is to provide an improved piezoelectric element which results in considerable improvement of mechanical and electrical reliability of the connecting portion, increase in yield and reduction of cost.

A further object of the invention is to provide an improved method of manufacturing a piezoelectric element resulting in an efficient, low cost product which may be produced with a relatively simple apparatus and facilities, and which provides a high productivity method for connecting a resonator and a lead.

A further object of the invention is to provide a batch treatment method of manufacturing a piezoelectric element which overcomes the problems of the prior art.

Still other objects and advantages of the invention will in part be obvious and will in part be apparent from the specification.

The invention accordingly comprises the several steps and the relation of one or more of such steps with respect to each of the others, and the apparatus embodying features of construction, combination of elements and arrangement of parts which are adapted to effect such steps, all as exemplified in the following detailed disclosure, and the scope of the invention will be indicated in the claims.

BRIEF DESCRIPTION OF THE DRAWINGS

For a fuller understanding of the invention, reference is had to the following description taken in connection with the accompanying drawings, in which.

DETAILED DESCRIPTION OF THE PREFERRED EMBODIMENTS

Figure 1:
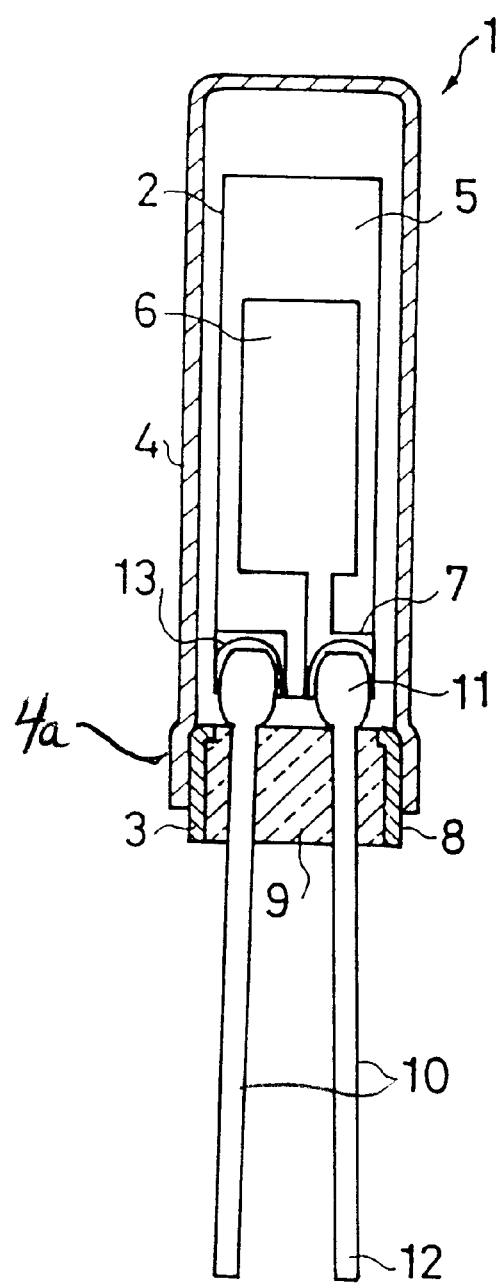
FIG. 1 is a cross-sectional view depicting a bar type AT-cut quartz crystal resonator constructed in accordance with the invention.

FIG. 1 depicts a first embodiment of a bar type AT-cut quartz crystal resonator of the invention, indicated generally at 1. Piezoelectric resonator unit 1 is further formed with a piezoelectric resonator 2, a plug 3 for supporting piezoelectric resonator 2, and a cylindrical metallic case 4 having a bottom 4a and enclosing piezoelectric resonator 2. Piezoelectric resonator 2 is itself further formed of a piezoelectric piece 5 comprising a thin rectangular quartz crystal plate. On the either side of piezoelectric plate 5, excitation electrodes 6, each having the same pattern, are formed with a thickness within a range of from 1,000 to 4,000 Å by evaporating or sputtering Ag (silver) on a Cr (chromium) primer. Excitation electrodes 6 may alternatively be formed of an Au (gold) having a thickness thinner than that of the silver. A connecting land 7 drawn out from each of excitation electrodes 6 is provided on each side of piezoelectric piece 5 at the lower end thereof.

Plug 3 is formed as a hermetic terminal, and is further formed with two leads 10 passing through a glass insulator 9 formed with a metal ring 8 positioned about the outer periphery thereof. Leads 10 each comprise a short, flat inner lead terminal 11 projecting from insulator 9 into case 4, and a thin, long pin-shaped outer lead terminal 12 extending from insulator 9 to the outside of cylindrical metallic case 4. Resonator 2 is cantilever-supported by plug 3. Each inner lead terminal 11 is fixed to the corresponding connecting land 7 by solder 13, and is electrically connected to excitation electrode 6. Resonator 2 is housed within case 4 and is sealed in an air-tight manner by inserting metal ring 8 into the opening of case 4, maintaining the internal environment at a predetermined pressure. The interior of case 4 is usually maintained as a vacuum or with a nitrogen atmosphere.

Each of inner lead terminals 11 is fixed to plug 3 before plug 3 is connected to resonator 2. The surfaces of lead terminals 11 are coated with solder 14 to a thickness within a range of from 10 to 20 μm and more preferably, about 15 μm, which is thinner than a conventional solder surface thickness of from 20 to 25 μm. Reduction of the thickness of solder 14 permits reduction of production cost through a decrease in the solder consumption and also reduction of the time required for the soldering process. Thus productivity is improved. Additionally, another advantage is that the problem of leads 10 bending during soldering is eliminated. Resonator 2 is soldered by positioning plug 3 so as to place inner lead terminals 11 on lands 7. Then the solder is melted by the reflow method by heating the solder with a hot blast, for example. In the invention, as a pretreatment for soldering resonator 2 to plug 3, the surfaces of lands 7 and inner lead terminals 11 may be individually treated by means of a surface treatment apparatus 15, as shown in FIG. 2.

Figure 2:
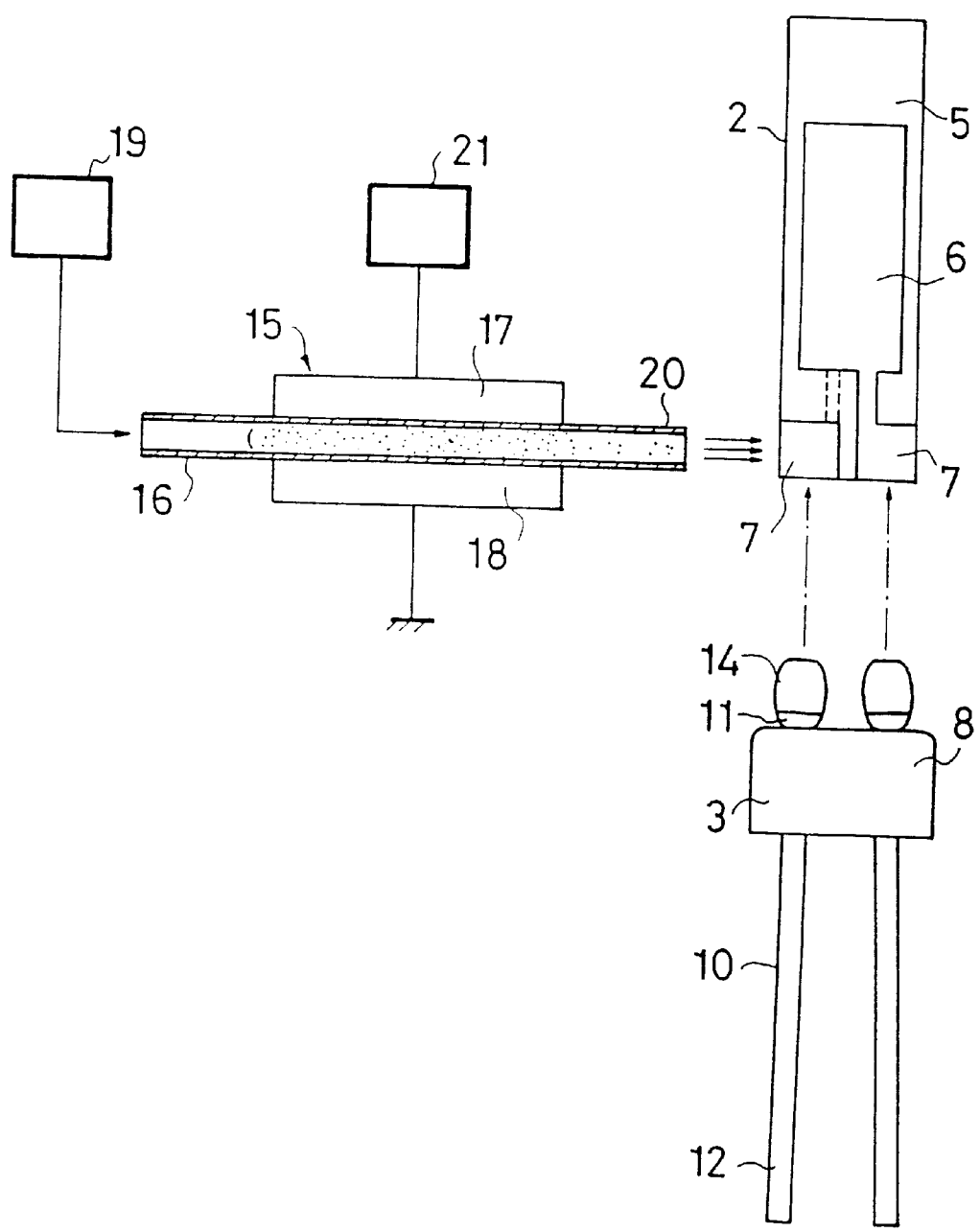
FIG. 2 is a schematic view of a structure for surface treatment of a piezoelectric resonator and the plug using a plasma generated at approximately atmospheric pressure in accordance with the invention.

As is further shown in FIG. 2, surface treatment apparatus 15 is provided with a discharge tube 16 formed as a long round glass tube and a pair of electrodes, including a source electrode 17 and a grounding electrode 18 arranged opposing each other and on opposite sides of discharge tube 16, discharge tube 16 being positioned therebetween. The base end of discharge tube 16 is connected to a discharge gas source 19. A nozzle portion 20 at the tip of discharge tube 16 is positioned facing toward the surface of land 7 or the surface of one of inner lead terminals 11 which is to be treated. By applying a prescribed voltage from a power source 21 to source electrode 17 while supplying a prescribed discharge gas from gas source 19 into the discharge tube 16, a gas discharge takes place between electrodes 17 and 18 in the discharge gas. An excited active species of the discharge gas generated by this gas discharge is ejected from nozzle portion 20 of discharge tube 16 in the form of a thin gas flow. Nozzle 20 of surface treatment apparatus 15 of this embodiment is formed with the bore therethrough of a size corresponding to the size of land 7. The generated active species does not contact the other portions of piezoelectric resonator 2, such as excitation electrodes 6. Thus, the surface treatment can be applied only to the surface of land 7. Additionally, land 7 is not directly exposed to discharge, only the active species comes into contact with the surface of land 7.

Figure 3:
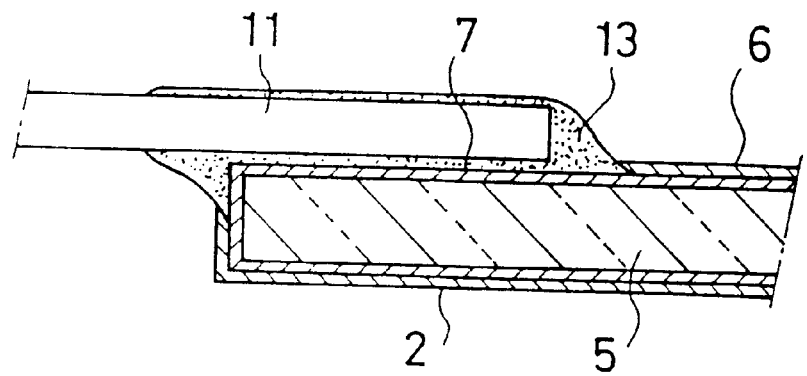
FIG. 3 is a partially enlarged cross-sectional view illustrating a soldered piezoelectric resonator and a plug in accordance with the invention.

In this embodiment of the invention, $CF_4$ is supplied as a discharge gas, and a low-frequency power source of 10 kHz is used to power electrodes 17 and 18. As a result, it is possible to carry out a fluorination treatment for converting the surface portion of a silver oxide thin film covering the surface of land 7 into a thin fluorinated layer. This fluorination treatment is carried out only to an extent to insure that a silver fluoride layer is not formed. This layer may be formed if the surface treatment is applied for too long a time. A similar fluorination treatment is also applied to the surface of soldering layer 14 of inner lead terminals 11 to form a thin fluorinated layer. Each of inner lead terminals 11 is placed on the previously surface-treated land 7, and as shown in FIG. 3, by heating with a hot blast of about 380° C. satisfactory soldering can be accomplished. This temperature is lower than the temperature required in a conventional apparatus, which requires a temperature within a range of from 430 to 450° C. In this embodiment, in which a low-frequency power source is employed, satisfactory gas discharge may be produced even without using an expensive rare gas such as helium as the discharge gas.

According to the invention, the wettability of the connection surfaces covered with oxide films, such as resonators and plugs can be uniformly and quickly improved by surface treating a workpiece using plasma generated at approximately atmospheric pressure as described above. An improved connecting environment is thus achievable as a result of the invention using a smaller amount of solder than in the process of the conventional art and at a lower heating temperature. Therefore, productivity can be improved. As a result of this improved process, there is no risk of the quartz crystal forming the piezoelectric substrate becoming distorted as a result of the surface treatment process. It is therefore possible to maintain stable, high performance and improve the yield during the production process, hence reducing the production cost. The surface treatment apparatus of the invention which uses plasma generated at approximately atmospheric pressure can be constructed very easily at a low cost. Additionally, the surface treatment apparatus of the invention can be incorporated into a soldering apparatus as a soldering pretreatment as part of an inline process, thereby permitting continuous surface treatment and soldering. Employment of this type of apparatus leads to a further improvement in quality and yield during production.

In an additional embodiment of the invention, a similar surface is treated by carrying out a halogenation surface treatment which utilizes a gas containing a halogen other than fluorine, for example, chlorine, bromine or iodine as a discharge gas. Thus, during use, a halogenized layer is formed on the surface of land 7 or inner lead terminals 11, whereby wettability of these surfaces can be improved.

Figure 4:
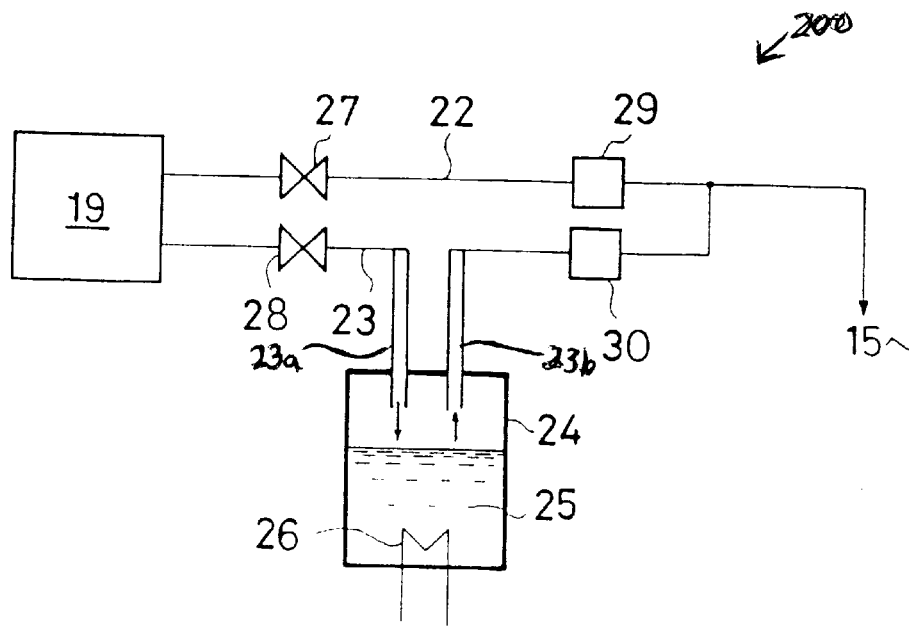
FIG. 4 is a block diagram illustrating an embodiment of a discharge gas supply system supplying compressed air and containing water constructed in accordance with the invention.

In a further embodiment of the invention, wettability of a surface to be soldered can be further improved by carrying out a reduction treatment of the surface of land 7 or inner lead terminals 11 using hydrogen, or a mixed gas containing at least nitrogen and water, such as compressed air. An apparatus, generally indicated as 200, constructed in accordance with this embodiment of the invention which utilizes such a mixed gas containing nitrogen and water as the discharge gas is shown in FIG. 4. In this system, a pipe conduit 22 places a gas source 19 and a surface treatment apparatus 15 in fluid communication with each other. A bypass 23 is provided, placing gas source 19 and a tank 24 in fluid communication. Compressed air is supplied from gas source 19 and is passed to tank 24 via a first bypass conduit 23a. Water (preferably pure water) 25 is stored in tank 24. Steam is generated by a heater 26 in tank 24. After interacting with steam contained in tank 24, the compressed air which was introduced into tank 24 is sent back to pipe conduit 22 via a second bypass conduit 23b. The ratio of water contained in the discharge gas fed to surface treatment apparatus 15 is appropriately adjusted by controlling the flow rate of compressed air sent from the gas source 19 through a pair of control valves 27 and 28 to pipe conduit 22 and bypass 23 by means of flow controllers 29 and 30, respectively, which operate as feedback control mechanisms.

Figure 5:
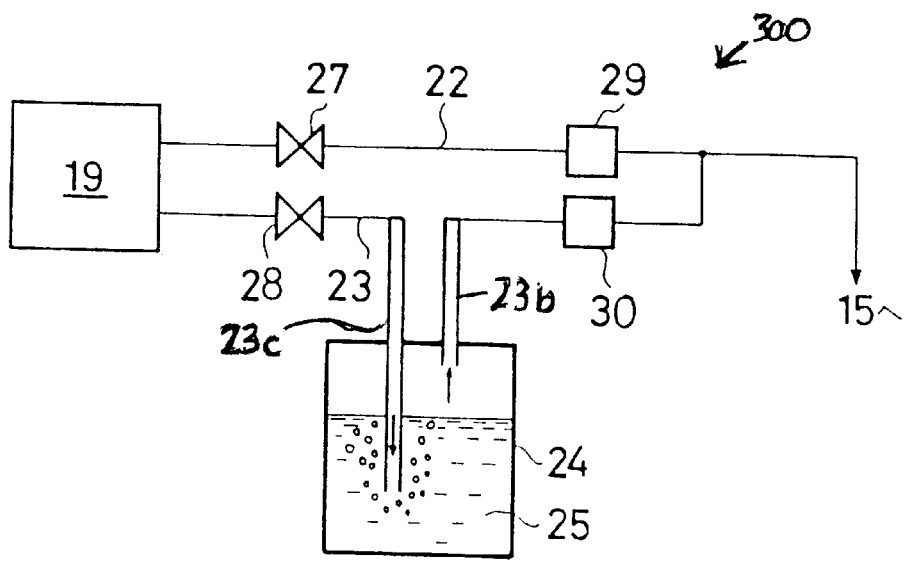
FIG. 5 is a block diagram illustrating an additional embodiment of the discharge gas supply system constructed in accordance with the invention.

FIG. 5 illustrates an additional embodiment of the discharge gas supply system, generally indicated as 300, which is similar to apparatus 200, like numerals indicating like structure. System 300 supplies compressed air containing water to surface treatment apparatus 15. In this embodiment of the invention, heater 26 of apparatus 200 is omitted from tank 24. In this embodiment compressed air introduced from gas source 19 to tank 24 via bypass 23 is ejected into water 25 through an extended bypass conduit 23c. This passing of compressed air through water 25 generates compressed air containing steam in the upper space of tank 24. This water-laden compressed air is then supplied to the foregoing surface treatment apparatus as a discharge gas containing nitrogen and water.

Figure 6:
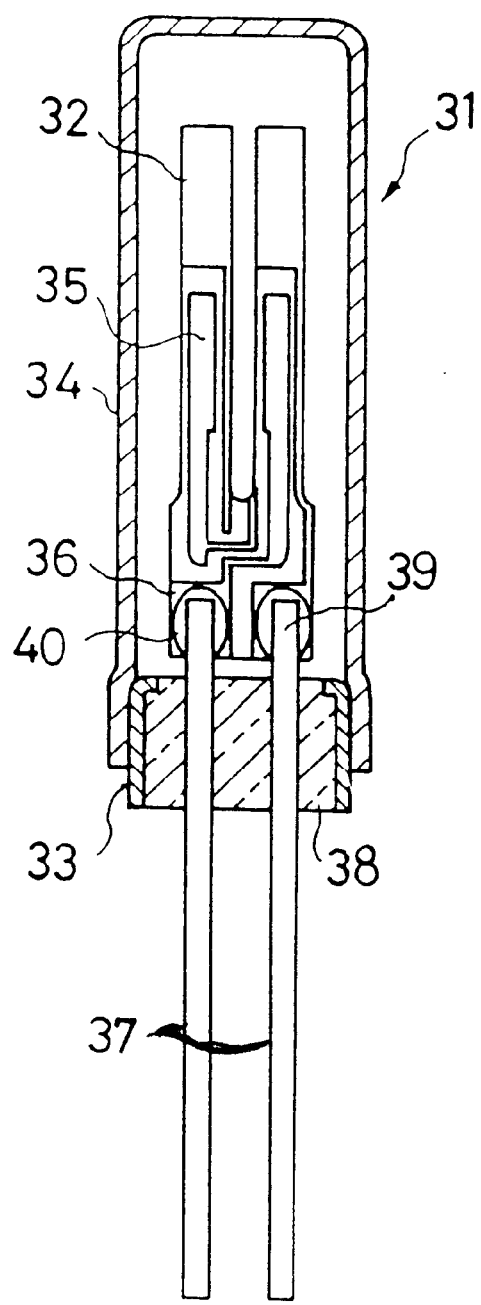
FIG. 6 is a cross-sectional view illustrating a tuning fork type piezoelectric resonator constructed in accordance with the invention.

FIG. 6 illustrates a tuning fork type piezoelectric resonator unit 31 constructed in accordance with an additional embodiment of the invention. Resonator unit 31 is formed with a piezoelectric resonator 32, a plug 33 supporting piezoelectric resonator 32 in a cantilever manner, and a cylindrical metallic case 34 formed with a bottom portion for housing piezoelectric resonator 32. Piezoelectric resonator 32 in this embodiment is constructed by forming a wafer comprising a thin quartz sheet into a desired turning fork shape and forming a pair of electrodes 35 on each side thereof. In this embodiment of the invention, each electrode 35 is patterned by the photolithography technique in which a thin film of gold (Au) is formed on a chromium (Cr) primer by evaporation or sputtering. Connection lands 36 are drawn out from electrode 35 and are provided on each side of resonator 32 at the lower end thereof.

Figure 7:
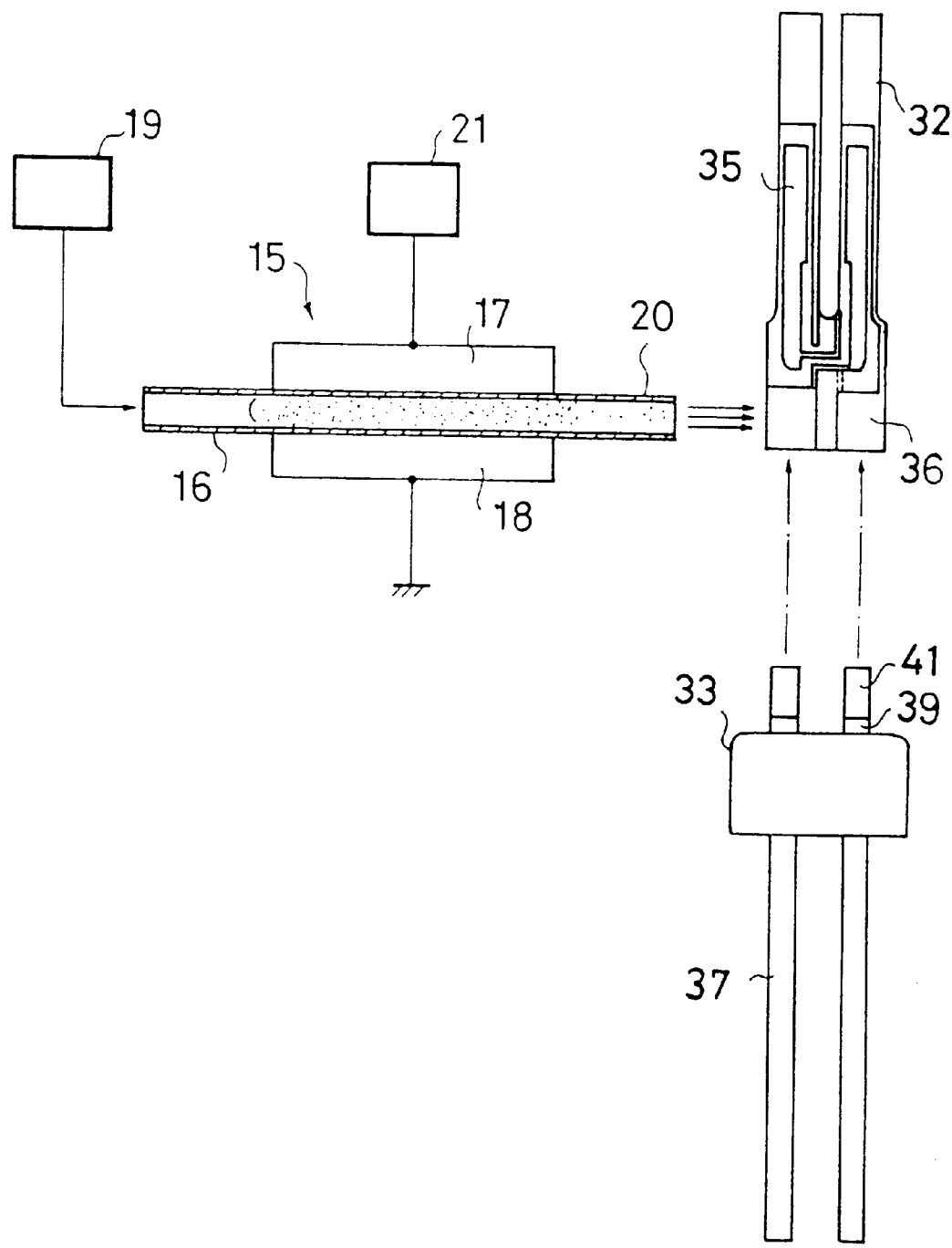
FIG. 7 is a schematic view of a structure for surface treatment of a tuning fork type piezoelectric resonator and the plug using a plasma generated at approximately atmospheric pressure an accordance with the invention.

Plug 33 is further formed with two leads 37 similar to leads 10 of FIG. 1. A short pin-shaped inner lead terminal 39 of each of leads 37 is formed projecting away from an insulator 38 and into the interior of case 34 and is connected to corresponding land 36 by solder 40. Thus, resonator 32 is supported in a cantilever manner by plug 33. Electrodes 35 are electrically connected to respective lands 36. Resonator 32 and plug 33 are soldered together by melting the solder previously deposited onto the surface of inner lead terminals 39 by the reflow process using apparatus 15 as shown in FIG. 7. Resonator 32 is supported by plug 33 and is sealed within case 34 in a vacuum or in a nitrogen atmosphere.

In accordance with the invention, prior to soldering resonator 32 and plug 33 together, the surfaces of lands 36 and inner lead terminals 39 are individually pre-treated by surface treatment apparatus 15, as is shown in FIG. 7. Surface treatment apparatus 15 has the same construction as that shown in FIG. 2, like elements being designated by like reference numerals. Gas discharge is caused in discharge tube 16 by applying a prescribed voltage to source electrode 17 from low-frequency power source 21, having a frequency of 10 kHz, while supplying $CF_4$ as a discharge gas from gas source 19. By ejecting a gas containing an excited active species of $CF_4$ generated by this gas discharge, a fluorination surface treatment is carried out to form a fluorinated layer. As a result of the improvement in wettability of the surfaces of lands 36 and inner lead terminals 39 achieved by this treatment, it is possible to obtain a satisfactory connection between the surfaces of lands 36 and respective inner lead terminals 39 using a smaller amount of solder and operating a lower heating temperature than in processes utilizing conventional art.

Additionally, in this embodiment of the invention, wettability of the connecting surfaces can be improved by forming a halogenized layer on these surfaces, even when lands 36 or inner lead terminals 39 have been surface-treated by the use of a gas containing a halogen other than fluoride such as chlorine, bromine or iodine as the discharge gas. Wettability can also be improved by reducing oxides on the surface of lands 36 or inner lead terminals 39 through a reduction treatment of the discharge gas using, for example, a gas containing hydrogen or a mixed gas containing at least nitrogen and water.

Figure 8:
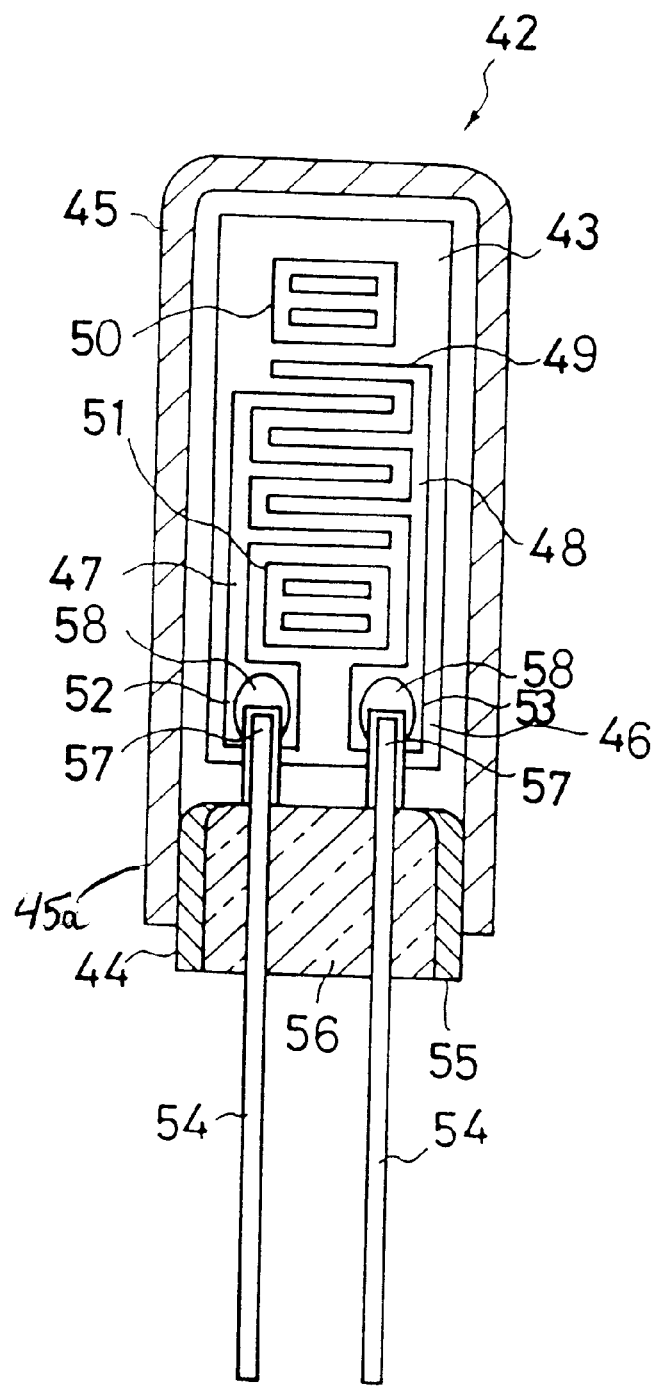
FIG. 8 is a cross-sectional view illustrating a SAW resonator constructed in accordance with the invention.

FIG. 8 depicts a SAW resonator unit 42 constructed in accordance with an additional embodiment of the invention. SAW resonator unit 42 is constructed in a manner similar to that of the above-mentioned piezoelectric resonator unit. A rectangular SAW resonator 43 is supported by a plug 44 in a cantilever manner. SAW resonator 43 is housed in an air-tight manner in a cylindrical metallic case 45 having a bottom 45a. SAW resonator 43 has a rectangular thin plate piezoelectric piece 46 cut out from a quartz crystal. An interdigital electrode (IDT) 49 is formed of a combination of comb-shaped electrodes 47 and 48 and is formed substantially at the center of the main surface of SAW resonator 43. In addition to quartz crystal, a lithium tantalate or a lithium niobate piezoelectric piece may be used as piezoelectric piece 46.

A pair of grating type reflectors 50 and 51 are respectively provided on each side of IDT 49 in the longitudinal direction. A pair of connecting lands 52 and 53 are drawn out from each of comb-shaped electrodes 47 and 48 and are provided on each side of the piezoelectric piece 46 at the lower end thereof. These electrodes, reflectors and leads are formed by patterning an aluminum (Al) thin film formed on the surface of piezoelectric piece 46 by vapor deposition or sputtering by photo-lithography. Conductive electrode materials such as gold (Au) and Aluminum-Copper (Al—Cu) alloy may be used in place of pure aluminum. Aluminum-based materials are preferable in order to reduce production costs.

Plug 44 is similar in form to plugs 9 and 38 of the piezoelectric resonator units 1 and 31 shown in FIGS. 1 and 6. Two leads 54 for electrically connecting SAW resonator 42 to an external electronic circuit pass through an insulator 56 comprising glass or other dielectric material fitted with a metal ring 55 on the outer periphery thereof. Inner lead terminals 57 project into case 45 from insulator 56 and are connected to lands 52 and 53 by solder 58. As a result, SAW resonator 43 is supported by plug 44 in a cantilever manner, and IDT 49 is electrically connected to leads 54. Soldering of inner lead terminals 57 and lands 52 and 53 is accomplished by utilizing the reflow process after solder has been deposited on the surface of inner lead terminals 57.

According to the invention, the surfaces of lands 52 and 53 and inner lead terminals 57 of SAW resonator unit 42 are surface treated with surface treatment apparatus 15, shown in FIGS. 2 and 7, before soldering. The solder wettability of the surfaces is improved by applying a halogenation treatment thereto. A discharge gas containing a halogen such as $CF_4$ may be utilized. A reduction treatment is then conducted containing at least nitrogen and water or a gas containing hydrogen. As a result, an improved connection between the parts with sufficient connection strength even when soldering with a smaller amount of solder and at a lower heating temperature than is typically used in the conventional, prior art processes. Thus, remarkable improvement in production process and in the mechanical and electrical reliability of the connection is achieved.

Figure 9:
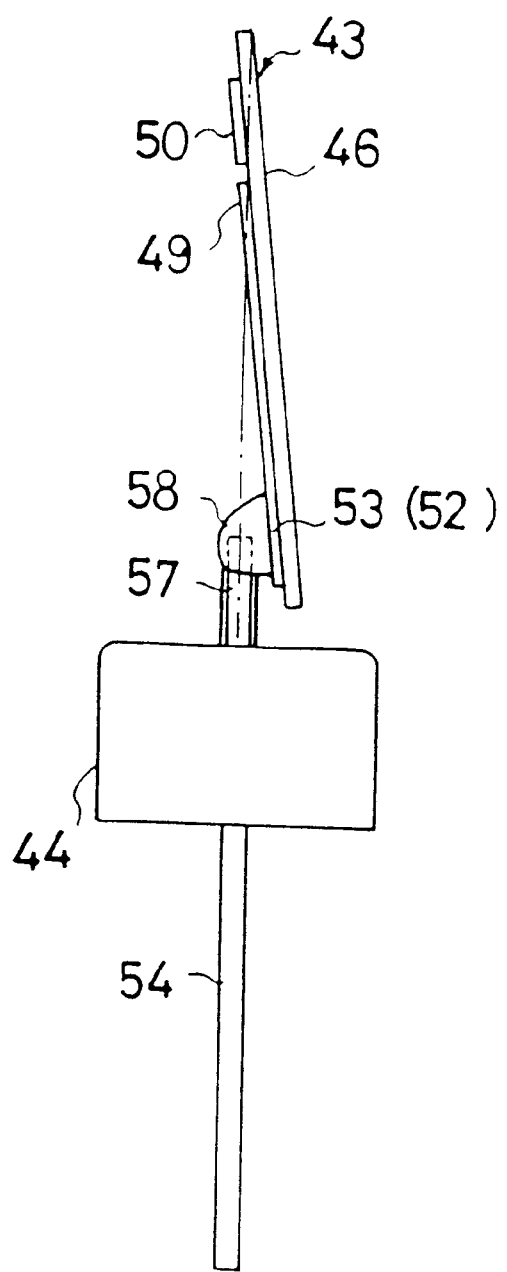
FIG. 9 is a side elevational view depicting the connection of the SAW resonator and the plug shown constructed in accordance with the invention.

In this embodiment, as shown in FIG. 9, SAW resonator 43 is supported at rest in an inclined state relative to the center axis of case 45 in which the surface thereof crosses the center axis of case 45. Thus, it is possible to arrange the positioning of SAW resonator 43 substantially at the center of case 45 by the effective utilization of space and maintain a sufficient gap between case 45 and SAW resonator 43 while allowing the proper functioning of SAW resonator 43. It is therefore possible to prevent the oscillation of SAW resonator 43 from becoming unstable as a result of contact between these components and case 45, or because of dust in case 45. By supporting SAW resonator 43 in a cantilever manner, the change in frequency and the extent of deformation of piezoelectric piece 46 can be minimized, thereby insuring a stable, high performance SAW resonator. According to this embodiment, it is therefore possible to minimize the effect of any distortion to SAW resonator unit 42 caused by external stress by cantilever-supporting an end of rectangular SAW resonator 43 so that it is maintained apart from case 45. Therefore, in accordance with the invention, a SAW resonator having a very stable resonance frequency and which maintains its characteristics over time is provided. SAW resonator 43, which is cantilever-supported by plug 44, is vacuum-sealed within case 45. By achieving substantially a vacuum within case 45, a SAW resonator having a high Q-value (sharpness of resonance) is provided. In an additional embodiment, case 45 may be formed as an oval cylindrical, a round can, or box shaped instead of being cylindrical.

In an additional embodiment, SAW resonator 43 can be supported diagonally by positioning inner lead terminals 57 at an incline relative to the center axis of case 45. In addition, by using flat inner lead terminals 57 to ensure a sufficient connection area, as are shown in FIG. 1, or by branching the tip of inner lead terminals 57 into at least two tips, it is possible to ensure a satisfactory connection between the components.

In any of the foregoing embodiments, the land and the inner lead terminals may be connected by a conductive paste such as silver paste or a conductive adhesive, in addition to soldering. When utilizing one of these alternative connection techniques which do not utilize solder, it is advantageous to ensure a sufficient mechanical strength of the unit by supporting either the piezoelectric resonator or the SAW resonator using a non-conductive adhesive. The use of a conductive adhesive mixed with an oxidation preventing agent additionally ensures stable electrical conductivity even after connection.

Figure 10:
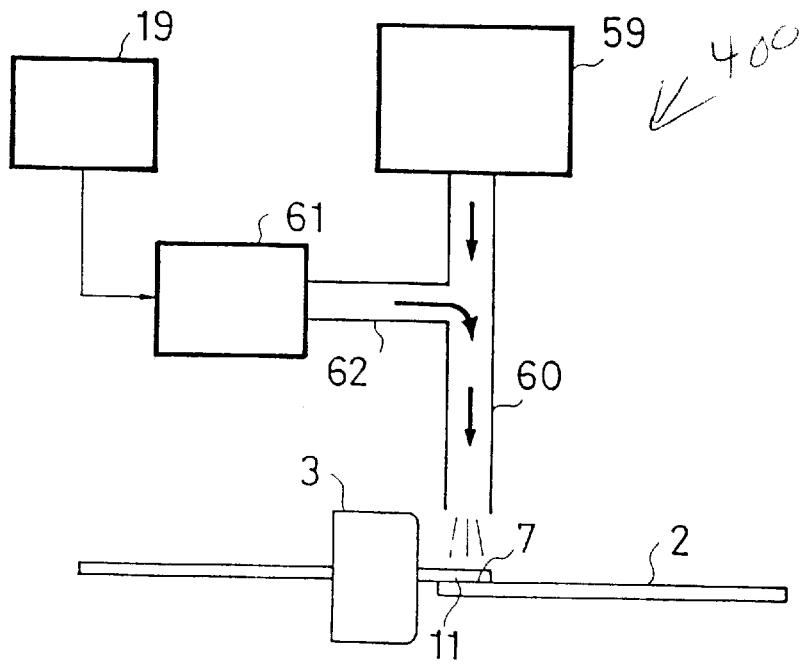
FIG. 10 is a schematic diagram of structure for soldering the piezoelectric resonator and the plug simultaneously with the surface-treating thereof in accordance with the invention.

FIG. 10 is a schematic view depicting structure 400 for performing a mounting process in accordance with an additional embodiment of the invention in which a piezoelectric resonator and a plug are surface treated and are simultaneously soldered together. In this embodiment, as in the embodiment shown in FIG. 1, piezoelectric resonator 2 of a bar type AT-cut quartz crystal resonator and plug 3 are connected. As is shown in FIG. 10, piezoelectric resonator 2 and plug 3 are arranged by relative positioning so that one inner lead terminal 11 is brought into contact with land 7. Prior to this operation, a thin layer of solder is deposited onto a surface of inner lead terminal 11.

Apparatus 400 includes a small bore nozzle 60 connected to a hot blast source 59. Nozzle 60 is arranged directly above the point of contact of inner lead terminal 11 and land 7. Hot blast source 59 is provided with a temperature-adjustable heater such as an electric heating coil. Thus, gas, such as nitrogen or the like is provided into a nozzle 60 at a predetermined temperature.

A discharge section 61, fed by a gas source 19, is connected through a connection tube 62 to a central portion along the length of nozzle 60. Discharge section 61, may comprise the discharge section of treatment apparatus 15 as shown in FIG. 2 comprising a pair of source electrode, described below, or any of the other various electrode constructions known conventionally in the art may be used to define discharge section 61.

Gas discharge is caused in a discharge gas at approximately atmospheric pressure by supplying the discharge gas from discharge gas source 19 to the gap between the electrodes in discharge section 61 and applying a predetermined voltage from the power source onto the source electrode. An excited active species of the discharge gas is generated and supplied through connection tube 62 into nozzle 60. This discharge gas is mixed with the hot blast of nitrogen supplied from hot blast source 59, and is ejected from the tip of nozzle 60. As a result, the connection surfaces of land 7 and inner lead terminal 11 are surface treated so as to improve the solder wettability thereof. At the same time, the solder deposit on inner lead 11 is melted and the two parts are soldered together.

In a preferred embodiment of the invention, nitrogen is supplied at a flow rate within a range of from 5 to 20 liters/minute from hot blast source 59 and $CF_4$ is supplied at a flow rate of 30 cc/m as a discharge gas from discharge gas source 19. A low-frequency power source of 10 kHz·10 kV is used in this preferred embodiment. Thus, satisfactory gas discharge may be produced without using an expensive rare gas such as helium as the discharge gas. The hot blast temperature is adjusted to be within a range of about 350 to 450° C. in accordance with the chemical composition of the solder used, as is known in conventional reflow soldering processes.

The hot blast containing the excited active species is ejected to land 7 and inner lead terminal 11 for a short period of time of about two seconds, as is also done in conventional reflow soldering processes. As a result, a fluorination treatment converts the surface layer of the connection surfaces into thin fluorinated layers, and the soldering process is carried out simultaneously with the fluorination treatment. Thus, a satisfactory connection may be provided between the connection surfaces while utilizing only a small amount of solder. Because it is not necessary to shield the mounting apparatus from ambient air in order to prevent oxidation of surface-treated land 7 and inner lead terminal 11, the structure of the apparatus as a whole is simple and inexpensive to produce and operate.

$CF_4$ is a suitable discharge gas for generating the excited active species to be contained in the hot blast since it is safe and easy to handle. Additionally, for example, a gas containing a halogen such as a fluorine compound including $SF_6$ is also suitable for use as a safe and easy to handle discharge gas. Cost effective nitrogen is particularly favorable for use as the gas for generating the hot blast. However, any other inert gas which prevents oxidation of the connection surfaces is also suitable.

While in apparatus 400 a heater is provided within hot blast source 59, the heater may alternatively be provided in nozzle 60 upstream of the position of connection tube 62. An electric heating coil arranged in nozzle 60 may be used. Since this heating coil is positioned upstream of the introduction of the active species to the hot blast and into nozzle 60 from correction tube 62, this heater will not deteriorate since it does not come into contact with the excited active species. It is therefore possible to ensure a longer service life of the heater.

Figure 11:
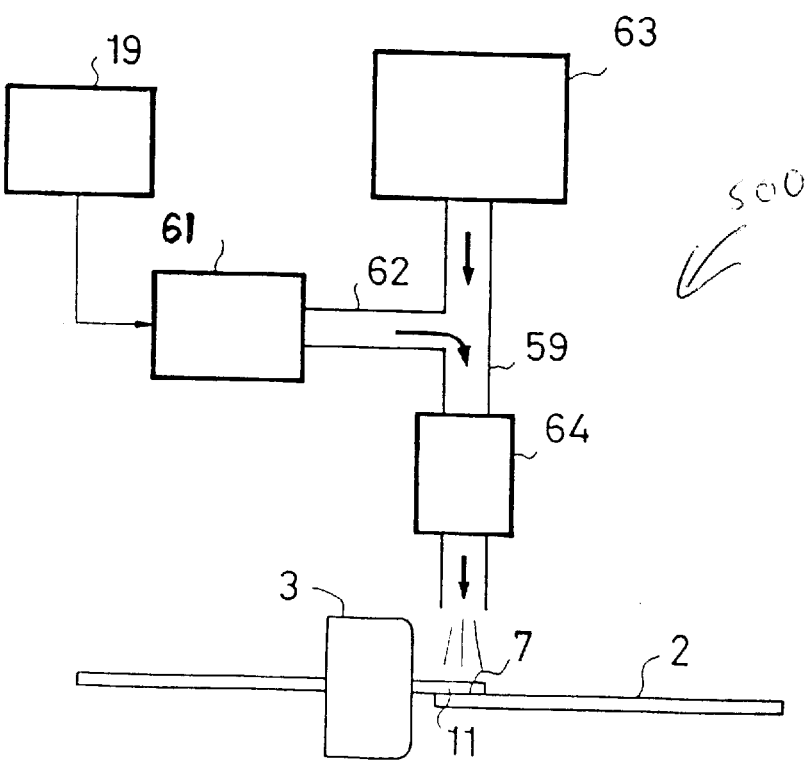
FIG. 11 is a schematic diagram of another embodiment of a structure for soldering the piezoelectric resonator and the plug in accordance with the invention.

FIG. 11 depicts an additional embodiment, generally indicated as 500, constructed in accordance with the invention, which is a variation of apparatus 400, like reference numerals denoting like elements. This embodiment differs from apparatus 400 in that a heater 64 is provided separate from hot blast gas source 63, and is further provided within nozzle 60, at a position downstream from the location of connection tube 62. When an electric heating coil is arranged in nozzle 60, the excited active species provided along connection tube 62 from discharge section 61 come into direct contact with heater 64, and heater 64 may deteriorate as a result of this contact. However, because of the positioning of heater 64 adjacent the lower exit portion of nozzle 60, it is possible to more accurately adjust temperature of the nitrogen gas and active species hot blast which is ejected onto land 7 and inner lead terminal.

Figure 12:
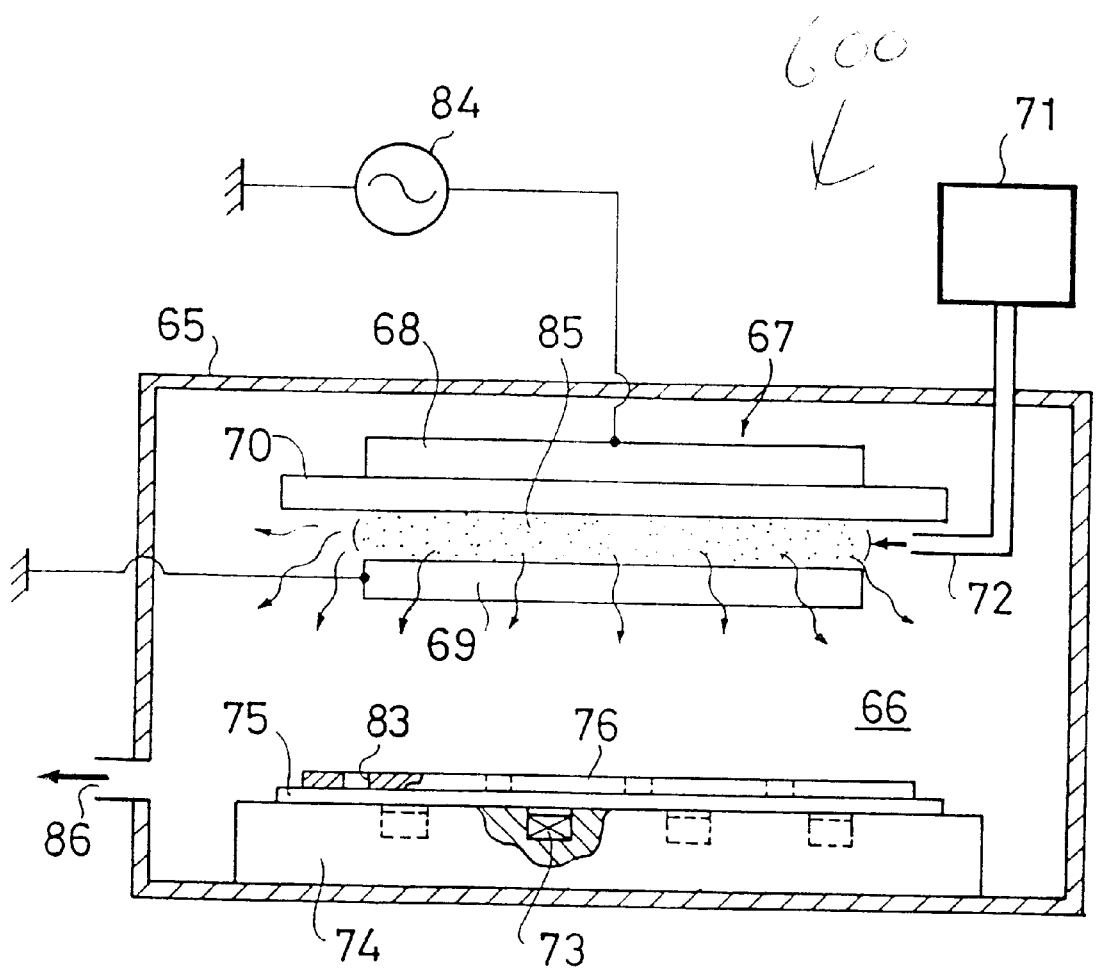
FIG. 12 is a sectional view illustrating a batch treatment apparatus using a plasma generated at approximately atmospheric pressure in accordance with the invention.

FIG. 12 is a schematic view illustrating the construction of a batch surface treatment apparatus, generally indicated as 600, constructed in accordance with an additional embodiment of the invention. Surface treatment apparatus 600 includes a box shaped casing 65 defining a chamber 66. A discharge section 67 is arranged in the upper portion of chamber 66 and is shielded from ambient air by box-shaped casing 65. Discharge section 67 includes a flat source electrode 68 and a grounding electrode 69 which are positioned opposing each other in the vertical direction and about a discharge section 67. A plate-shaped dielectric 70, which is preferably formed of glass or a ceramic material, is arranged on the bottom surface of source electrode 68 to suppress any abnormal or unwanted discharge. A nozzle 72 is connected to an external discharge gas source 71 and is positioned adjacent to discharge section 67. Nozzle 72 opens toward the gap between dielectric 70 and grounding electrode 69.

A table 74 having magnets 73 buried at predetermined positions of the upper surface thereof is provided on the bottom of chamber 66 as is shown in FIG. 12. A quartz crystal wafer 75 is positioned on table 74 at a predetermined position by appropriate guiding means. A mask 76 is placed upon crystal wafer 75 and is positioned by the same appropriate guiding means. Quartz crystal wafer 75 of this embodiment is similar to the type of Quartz crystal wafer which is conventionally used for manufacturing of tuning fork type quartz crystal resonators.

Figure 13:
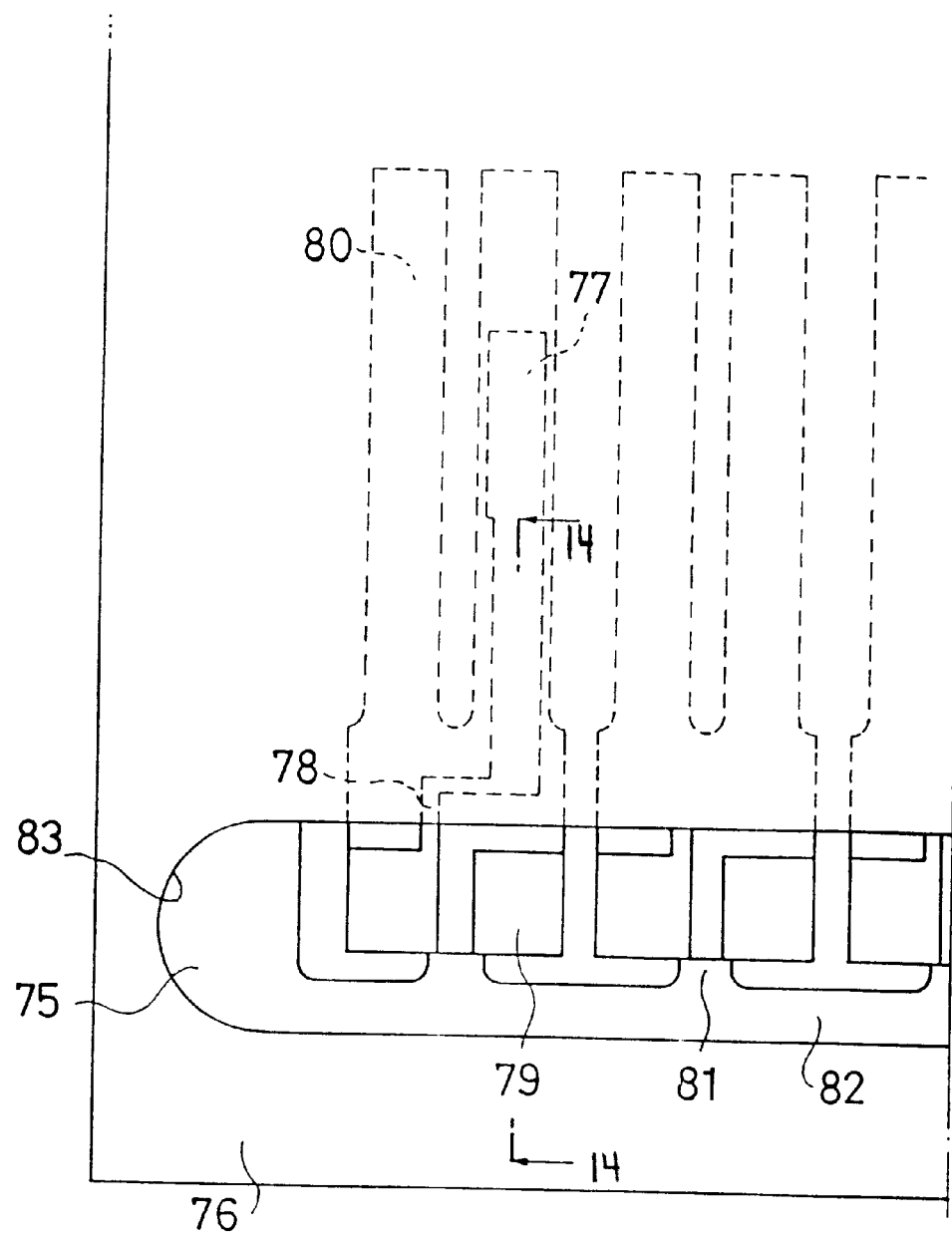
FIG. 13 is a partially enlarged top plan view illustrating a mask used in the batch treatment apparatus.

As is further shown in FIG. 13, several hundred tuning fork shapes are formed through etching of quartz crystal wafer 75 having a predetermined thickness. Films are then patterned on either side of each tuning fork shaped etching to form an excitation electrode 77, an outgoing electrode 78 and a land 79. The base ends of each of the individual piezoelectric resonators 80 are bonded at prescribed intervals in the longitudinal and transverse directions to frame portions 82 of the wafer 75 by tie-bar 81.

Figure 14:
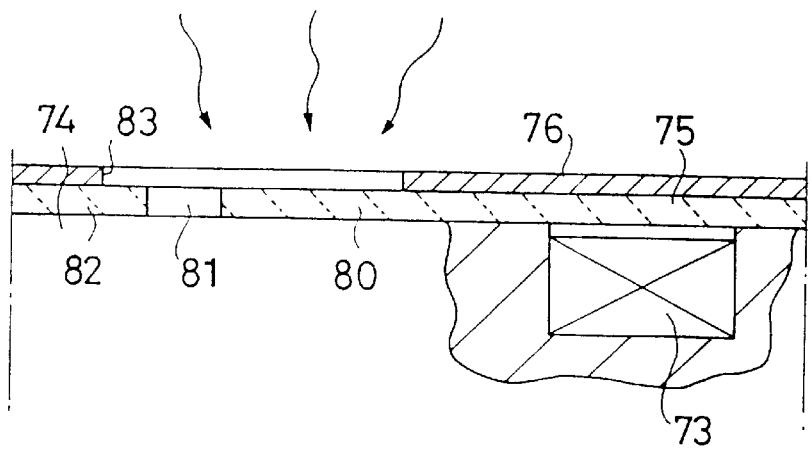
FIG. 14 is a cross-sectional view taken along 14—14 of FIG. 13.

Mask 76 preferably comprises, for example, a sheet having a thickness of from 0.1 to 0.2 mm of a magnetic metallic material such as SUS430 stainless steel. A thin, straight mask hole 83 having a width corresponding to the size of land 79 is formed in mask 76. As is shown in FIG. 13, mask hole 83 is aligned so that only each land 79 and the wafer portion surrounding each land 79 of each piezoelectric resonator 80 are exposed. Thus, excitation electrode 77 and outgoing electrode 78 are shielded. Mask 76 is then magnetically attracted to table 74 by magnets 73 as shown in FIG. 14 and is brought into close contact with the upper surface of wafer 75. In an alternative embodiment, mask 76 may be secured to table 74 with tightening means such as a screw or other appropriate fastener in place of the magnet.

Referring once again to FIG. 12, a discharge gas is then supplied from discharge gas source 71, and a prescribed voltage is applied from a power source 84 onto source electrode 68 while the discharge gas is ejected from nozzle 72 into the gap between dielectric 70 and grounding electrode 69. Gas discharge takes place in this gap, and an excited active species of the discharge gas is generated in discharge region 85. The generated excited species substantially uniformly diffuses from this gap into chamber 66. The generated excited species treats the surface of land 79 of each resonator 80 exposed from each mask hole 83. Even when the atmosphere in the chamber is not totally substituted by the discharge gas and the excited active species thereof as a result of an increase in the discharge gas flow rate, a predetermined density of the excited active species in the chamber can be reached and can sufficiently improve the solder wettability of the portions being surface treated.

In this embodiment of the invention, as in the embodiments described above, $CF_4$ may be utilized as the discharge gas and is preferably supplied at a flow rate of 30 ccm. A low-frequency power source of 10 kHz·10 kV is also employed, with a short discharge time of about two minutes. All of piezoelectric resonators 80 are thus subjected to a fluorination treatment. A thin fluorinated layer is formed on the surface of each land, resulting in a uniform increase in solder wettability. In addition, the fluorine-based excited active species is stable and has a long life. Particularly, $CF_4$ has a higher density of excited active species even as compared with HF. Therefore, it is not necessary to forcibly exhaust or ventilate the air from chamber 66.

Treated wafer 75 is removed from chamber 66 after exhausting the excited active species through an exhaust port 86 provided in the lower part of casing 65. Each resonator 80 is cut off from frame portion 82 as is known in conventional prior art processes. After connection to the inner lead terminal of the plug, resonator 80 is housed in the case resonator unit case.

In this embodiment of the invention, treatment of a single wafer in the chamber has been described. However, as long as the density of the excited active species is greater than a predetermined value, and is uniform, a plurality of wafers can be arranged in the chamber and simultaneously treated. Additionally, as long as it is possible to generate an excited active species without causing direct discharge with the wafer, and as long as it is possible to surface treat workpieces by causing uniform diffusion of the active species in the chamber, discharge section 67 and nozzle 72 may have any of a number of various other constructions and shapes. Furthermore, as long as an atmosphere of an excited active species of the discharge gas can at least be formed around the wafer to be treated, it is not always necessary to provide an air-tight chamber 66.

While in the embodiments of the invention shown in FIGS. 12 to 14, a tuning fork type resonator in which a plurality of piezoelectric resonators take the form of wafers has been described, the batch treatment apparatus of this embodiment of the invention is also applicable where electrodes are formed as individual piezoelectric pieces as in the bar type AT-cut quartz crystal resonator shown in FIG. 1 and the SAW resonator shown in FIG. 8.

Figure 15:
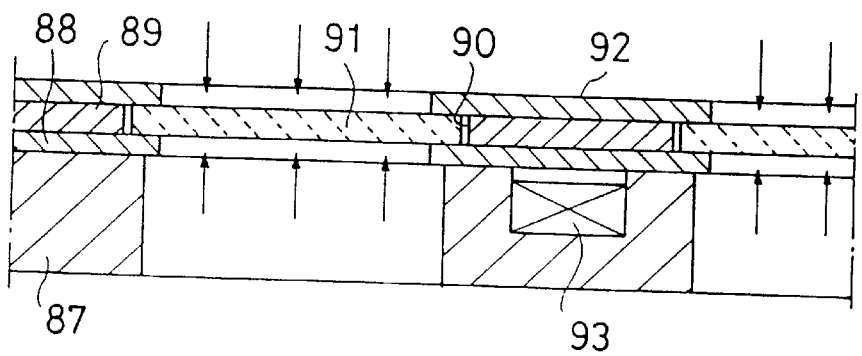
FIG. 15(A) is a cross sectional view illustrating a batch treatment apparatus for treating a piezoelectric resonator in accordance with an additional embodiment of the invention.
FIG. 15(B) a cross sectional view of a batch treatment apparatus for treating a piezoelectric resonator in accordance with an additional embodiment of the invention.
Figure 15:
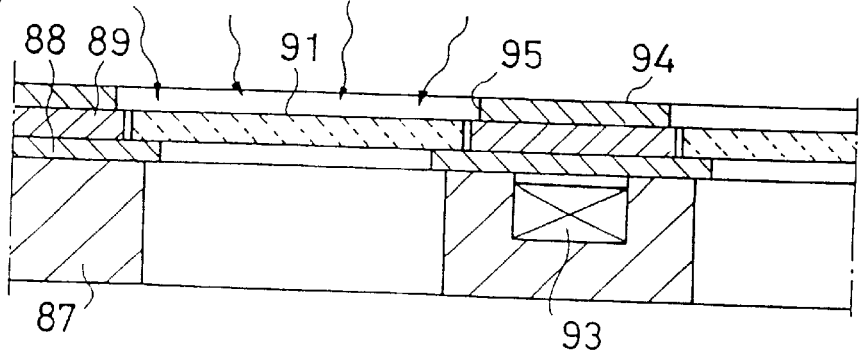

FIGS. 15(A) and 15(B) illustrate a preferred embodiment which is applicable when batch-treating an AT-cut quartz crystal resonator. The embodiment of FIGS. (A), 15(B) differs from the embodiment of FIG. 14 by treating both sides of a wafer, like numerals being used to identify like structures. FIG. 15(A) depicts a conventional apparatus and process for forming electrodes on both surfaces of a quartz crystal piece cut from a wafer. A lower mask 88 and an alignment plate 89 for positioning a workpiece are placed over a base plate 87. A quartz crystal piece 91 is positioned in a rectangular opening 90 provided in the alignment plate 89. An upper mask 92 identical with lower mask 88 is placed adjacent quartz crystal plate 90 on the top thereof as shown in FIG. 15(A). In a preferred embodiment, 200 to 400 quartz crystal pieces can be treated with a single set of masks.

At least upper mask is made of a magnetic material such as SUS430 stainless steel. A magnet 93 is buried in the upper surface of base plate 87. Thus, upper mask 92 and quartz crystal piece 91 are held at predetermined positions by the magnetic attraction between magnet 93 and upper mask 92. Finally, chromium (Cr) and silver (Ag) are simultaneously vapor-deposited from above and below to form electrodes on each of the surfaces of each quartz crystal piece 91 simultaneously time.

According to this embodiment of the invention, as is depicted on FIG. 15(B) upper mask 92 is removed, and a surface treatment mask 94 formed of a magnetic material such as SUS430 stainless steel is positioned in its place. Surface treatment mask 94 is formed with a mask hole 95 for exposing only the land portion of the electrode formed on the upper surface of each quartz crystal piece 91. The plurality of quartz crystal resonators arranged on base plate 87 are then placed in a chamber such as is shown in FIG. 12. The land portions exposed through mask holes 95 are surface-treated by means of the generated excited active species of the discharge gas.

Using such an apparatus, it is possible to surface treat a plurality of AT-cut quartz crystal resonators to improve solder wettability through a batch treatment process simply by adding the surface treatment process of this embodiment of the invention to the conventional production process. The treatment apparatus of this embodiment is equally applicable to the production SAW resonator.

Gold (Au) films and silver (Ag) films which are used to form the electrodes of these piezoelectric resonators in general tend to allow for easy flow of solder when the solder is melted. Therefore in an additional embodiment constructed in accordance with the invention, a pre-treatment for lowering the solder wettability of an entire electrode formed on the surface of a piezoelectric resonator is applied. Thus, only the wettability of the land portion is improved. Thus the melted solder will flow along the land portion, but will be prevented from flowing from the land portion to the electrode.

Figure 16:
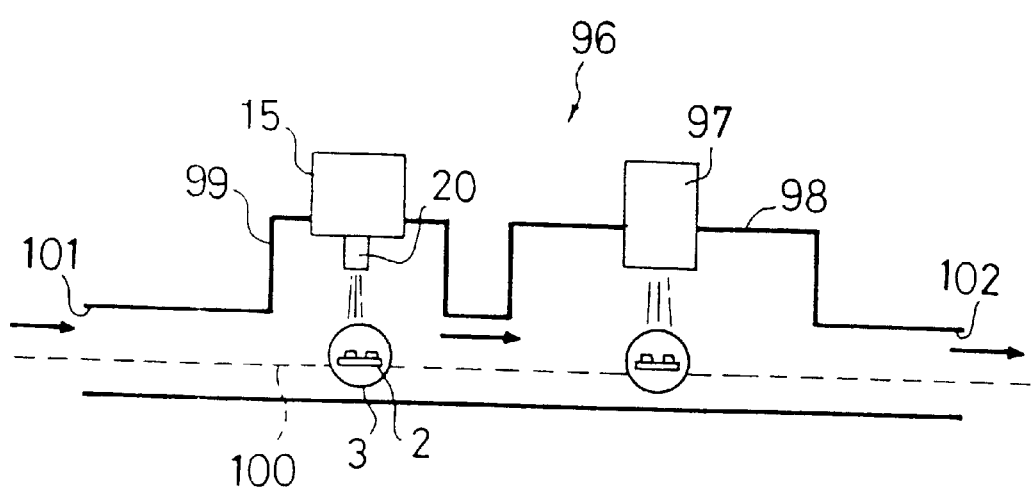
FIG. 16 is a schematic view of an inline apparatus for soldering a piezoelectric resonator and a plug constructed in accordance with the invention.

FIG. 16 schematically depicts the construction of an inline apparatus 96 for soldering a piezoelectric resonator 2 and a plug 3 in the piezoelectric resonator shown in FIG. 1. Inline apparatus 96 comprises a heating section 98 having a blower 97 for ejecting a hot blast for conducting reflow soldering. A pre-treatment section 99 having a surface treatment apparatus 15, as is shown in FIGS. 2 and 7 is provided upstream of heating section 98 for pre-solder treatment. A conveyor belt 100 is provided within inline apparatus 96. Piezoelectric resonator 2 and plug 3 are carried on conveyor belt 100 and are continuously transferred from an entry portion of inline apparatus 96 toward an exit 102 of inline apparatus.

Piezoelectric resonator 2 and plug 3 are exposed to an excited active species of a discharge gas which is blown from nozzle 20 in pre-treatment section 99. This process subjects the workpiece to a surface treatment process for improving the wettability of the surfaces to the solder. Next, in heating section 98, soldering is accomplished by the hot blast which blown from blower 97 which melts solder which had been previously applied. Thus, according to the invention, surface treatment apparatus 15 can easily be incorporated into an inline process. The surface treatment of a workpiece utilizing plasma generated at approximately atmospheric pressure can be easily implemented, thus leading to a reduction of the cost of production and an improvement in production productivity.

In another embodiment of the invention, any one of a number of conventional heating means such as an infrared-ray heater, a laser, an optical beam such as xenon, a soldering iron, or electric resistance may be used in place of the blower. As is clear to a person skilled in the art, various modifications maybe made to the apparatuses set forth in the specification within the technical scope of the invention.

Figure 17:
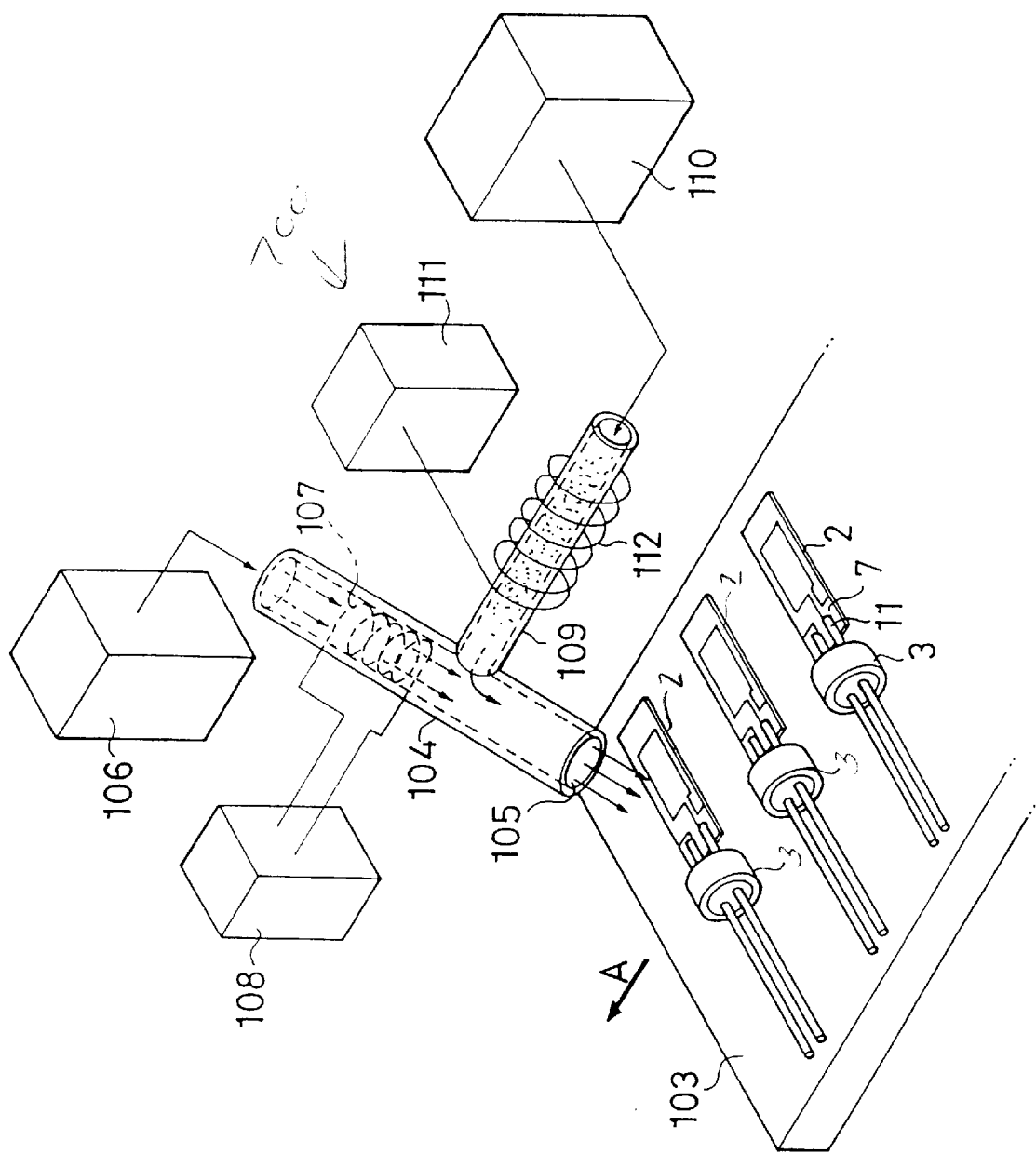
FIG. 17 is a schematic view of an embodiment of a mounting apparatus constructed in accordance with the invention simultaneously carrying out a surface treatment and soldering of the piezoelectric resonator and the plug.

FIG. 17 is a schematic perspective view illustrating the construction of a mounting apparatus, generally indicated as 700, suitable for carrying out a mounting process which allows for the simultaneous implementation of a surface treatment process and a soldering process to the piezoelectric resonator and the plus as described above with reference to apparatus 400. Piezoelectric resonators 2 and plugs 3 are arranged at certain predetermined intervals on a setting plate 103. Setting plate 103 is carried on a conveyor belt (not shown) as in the case of the inline apparatus shown in FIG. 16. Setting plate 103 is transferred by the conveyor belt at a predetermined speed in the direction of arrow A in FIG. 16.

In the center of the width of setting plate 103 along the direction of travel, a nozzle 104 for ejecting a hot blast is arranged directly above piezoelectric resonator 2 and plug 3 with a leading end opening 105 of nozzle 104 thereof directed toward lands 7 and inner lead terminals 11. Nozzle 104 of this embodiment comprises a thin, long, straight glass tube, with the upper end thereof coupled to a hot blast gas source 106. A heater 107 comprising an electric heating coil is provided within nozzle 104, and is connected to an external power source 108. A commercial power source of 50 Hz·40 to 50 V may be used, as is known in the conventional art.

A discharge tube 109 communicating with the interior of nozzle 104 is connected at the midportion of nozzle 104 downstream from heater 107. Discharge tube 109 is formed of, for example, a dielectric such as alumina, with the end thereof opposite to leading end opening 105 connected to a discharge gas source 110. A coil electrode 112 is connected to a discharge power source 111 and is wound about the outer periphery of discharge tube 109.

In this embodiment, nitrogen is used as the gas for the hot blast. This hot blast is supplied from hot blast gas source 106 to nozzle 104 at a flow rate of 5 to 20 liters/minute, and heated to an appropriate predetermined temperature by heater 107. The heating temperature is adjusted within, for example, a range of from about 350 to 450° C. as in the case of conventional reflow soldering and depends upon the kind of solder being used.

Simultaneously with the application of this hot blast, a voltage of 10 kHz·10 kV is applied from discharge power source 111 to coil 112 while supplying $CF_4$ as a discharge gas is supplied at a flow rate of 30 ccm from discharge gas source 110 to discharge tube 109. As a result, in discharge tube 109, a gas discharge takes place in the discharge gas at approximately atmospheric pressure, and an excited active species of $CF_4$ is generated. The generated excited active species is supplied through discharge tube 109 to nozzle 104, mixed with the nitrogen hot blast heated by heater 107, and continuously ejected from leading end opening 105 of nozzle 104. Each pair of piezoelectric resonator 2 and plug 3 positioned on setting plate 103 receive irradiation of the hot blast onto lands 3 and the inner lead terminals 11 thereof upon passing under nozzle 104. As a result, the surfaces of lands 3 and inner lead terminals 11 are surface-treated so as to improve solder wettability. At the same time, a thin deposit of solder previously formed on the surface of inner lead terminals 11 melts and solders lands 3 and inner lead terminals 11 together. A short irradiation time of only two seconds is sufficient, as in the case of a conventional reflow soldering process.

Since the surface treatment and soldering of the lands and the inner lead terminals are carried out in parallel, it is not necessary to prevent oxidation of the connection parts by shielding these parts from ambient air after surface treatment. Except for replacement of nozzle 104 and addition of the discharge mechanism, a conventional mounting apparatus as is known in the art can be employed in the invention.

Figure 18:
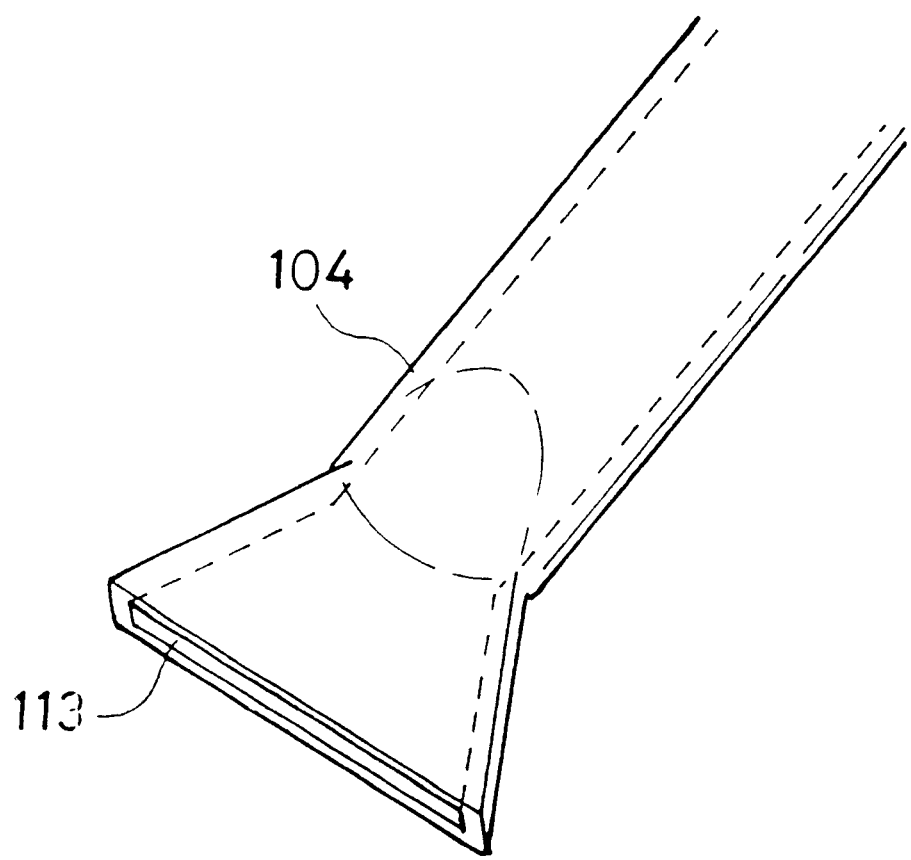
FIG. 18 is a perspective view illustrating a variation of a nozzle used in the mounting apparatus shown in FIG. 17 and constructed in accordance with the invention.

To avoid deterioration of the heater 107 from coming into contact with the excited active species, discharge tube 109 may be connected to nozzle 104 downstream of the position of heater 107. The nozzle shape, heater, discharge tube and electrode structure may be of any number various shapes and structures other than those described above. For example, a thin and long slit-shaped tip opening 113 may be provided transversely at the end of nozzle 104, as is shown in FIG. 18.

This embodiment has been described with reference to a bar type AT-cut quartz crystal resonator. The present invention is of course applicable also in the manufacturing process of a tuning fork type resonator or a SAW resonator.

According to the present invention having the construction as described above, the following advantages are achievable.

According to the piezoelectric elements of the invention, improvement of the wettability of the piezoelectric resonator and connection surface of the electrode or the lead terminal makes it possible to satisfactorily solder the lead terminal and connection surface of the electrode with a smaller amount of solder and at a lower heating temperature than is necessary in conventional practice, thus permitting remarkable improvement in the reliability of the piezoelectric resonator.

According to the methods of manufacturing a piezoelectric of the invention, improvement of the wettability of the piezoelectric resonator and the connection surface of the electrode or the lead can easily and safely be improved by the action of applying the excited active species of a discharge gas generated at approximately atmospheric pressure to these parts. As a result, it is possible to satisfactorily solder the piezoelectric resonator and the lead terminal together with a smaller amount of solder and at a lower heating temperature than is required during a conventional soldering process. Thus an improvement in yield, reduction in production cost, and improvement in the productivity of production through achievement of an inline manufacturing process, together with a remarkable improvement of reliability of the produced piezoelectric element can be realized.

According to the methods of manufacturing of a piezoelectric element of the invention, the electrode and the lead terminal which are soldered together have an improved wettability from using a hot blast containing the excited active species of the discharge gas. Thus a satisfactory connection is always ensured, and an improvement in product quality and production productivity is achieved. Furthermore, it is not necessary to prevent oxidation of the treated parts by shielding the piezoelectric resonator and the lead from ambient air after surface treatment. Thus, the construction of the manufacturing facilities can be simplified.

According to the mounting apparatuses of a piezoelectric resonator of the invention, a hot blast and excited active species of a discharge gas are ejected simultaneously through a single nozzle to achieve improvement of solder wettability and soldering simultaneously. An improvement in productivity and quality is achieved. Since it is not necessary to shield the electrode and the lead from ambient air after surface processing to prevent oxidation, the apparatus as a whole can be downsized and simplified. It is therefore possible to achieve effective utilization of the space in a manufacturing facility, to achieve an improvement in the ease of maintenance, and to achieve a reduction in the manufacturing cost.

According to the methods of manufacturing a piezoelectric element of the invention, it is possible to provide a batch treatment apparatus in which connection surfaces of a plurality of piezoelectric resonators are surface-treated simultaneously by using masks, thus largely improving productivity. For portions not surface treated, solder or other brazing material become harder to flow thereover even when it is exposed to high temperatures during the process of connecting the electrode and the lead terminal, or during the use of the piezoelectric element. Satisfactory connection between the electrode and the lead terminal is therefore ensured when utilized with a smaller amount of solder than is utilized in conventional soldering processes. Additionally, the quality of the product is improved and the cost of production is reduced. It is also possible to prevent changes in frequency or CI-value with time, thus permitting long-term maintenance of performance and quality of the piezoelectric element.

It will thus be seen that the objects set forth above, among those made apparent from the preceding description, are efficiently attained and, since certain changes may be made in carrying out the above method and in the construction set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. A method of manufacturing a piezoelectric element having a lead terminal for electrically connecting an electrode formed on the surface of a piezoelectric piece to an external electrical circuit, said piezoelectric element being sealed in a case, comprising the steps of:

arranging at least one mask in close contact onto a plurality of said piezoelectric resonators arranged at predetermined positions so as to expose a connection surface of an electrode associated with each piezoelectric resonator;

exposing said connection surface to an excited active species of a discharge gas generated by causing plasma discharge in a predetermined discharge gas at approximately atmospheric pressure to surface treat said connection surface; and connecting said lead terminal to said connection surface while said lead terminal and said connection surface are exposed to said active species.

2. The method of manufacturing a piezoelectric element of claim 1, wherein said plurality of piezoelectric resonators are formed as a piezoelectric wafer, said electrodes being formed on the surfaces of each of a plurality of turning fork shapes.

3. The method of manufacturing a piezoelectric element of claim 1, wherein said plurality of piezoelectric resonators are formed as individual piezoelectric chips having said electrodes formed on the respective surfaces thereof.

4. The method of manufacturing a piezoelectric element of claim 1, wherein said plurality of piezoelectric resonators and said masks, being arranged in close contact thereto; are arranged in a chamber, the connection surfaces of said electrodes being surface treated by diffusing the excited active species of said discharge gas in said chamber.

5. A method of manufacturing a piezoelectric element having a lead terminal for electrically connecting an electrode formed on the surface of a piezoelectric piece to an external electrical circuit, said piezoelectric element being sealed in a case, comprising the steps of:

arranging at least one mask in close contact onto a plurality of said piezoelectric resonators arranged at predetermined positions so as to expose a connection surface of an electrode associated with each piezoelectric resonator;

exposing said connection surface to an excited active species of a discharge gas generated by causing plasma discharge in a predetermined discharge gas at approximately atmospheric pressure to surface treat said connection surface; and connecting said lead terminal to said connection surface while said lead terminal and said connection surface are exposed to said active species, wherein said at least one mask is formed of a ferromagnetic material and are brought into close contact with said piezoelectric resonators by magnetic attraction between said at least one mask and a base plate having said plurality of piezoelectric resonators placed thereon and being positioned between said at least one mask and said base plate.

6. The method of manufacturing a piezoelectric element of claim 5, wherein said plurality of piezoelectric resonators are formed as a piezoelectric wafer, said electrodes being formed on the surfaces of each of a plurality of turning fork shapes.

7. The method of manufacturing a piezoelectric element of claim 5, wherein said plurality of piezoelectric resonators are formed as individual piezoelectric chips having said electrodes formed on the respective surfaces thereof.

8. The method of manufacturing a piezoelectric element of claim 5, wherein said plurality of piezoelectric resonators and said masks, being arranged in close contact thereto, are arranged in a chamber, the connection surfaces of said electrodes being surface treated by diffusing the excited active species of said discharge gas in said chamber.

* * * * *